United States Patent
Huang et al.

(10) Patent No.: US 11,232,960 B2
(45) Date of Patent: Jan. 25, 2022

(54) PICK-AND-PLACE TOOL HAVING MULTIPLE PICK UP ELEMENTS

(71) Applicant: ASML NETHERLANDS B.V., Veldhoven (NL)

(72) Inventors: Yang-Shan Huang, Veldhoven (NL); Alexey Olegovich Polyakov, Veldhoven (NL); Coen Adrianus Verschuren, Eindhoven (NL); Pieter Willem Herman De Jager, Middelbeers (NL)

(73) Assignee: ASML Netherlands B.V., Veldhoven (NL)

( * ) Notice: Subject to any disclaimer, the term of this patent is extended or adjusted under 35 U.S.C. 154(b) by 239 days.

(21) Appl. No.: 16/300,595

(22) PCT Filed: Apr. 20, 2017

(86) PCT No.: PCT/EP2017/059391
§ 371 (c)(1),
(2) Date: Nov. 12, 2018

(87) PCT Pub. No.: WO2017/194286
PCT Pub. Date: Nov. 16, 2017

(65) Prior Publication Data
US 2019/0148189 A1    May 16, 2019

(30) Foreign Application Priority Data
May 13, 2016    (EP) ..................................... 16169553

(51) Int. Cl.
*H01L 21/67*    (2006.01)
*H05K 3/30*    (2006.01)
*H01L 21/683*    (2006.01)

(52) U.S. Cl.
CPC .. *H01L 21/67144* (2013.01); *H01L 21/67011* (2013.01); *H01L 21/67259* (2013.01); *H01L 21/6838* (2013.01); *H05K 3/30* (2013.01)

(58) Field of Classification Search
CPC ........... H01L 21/6838; H01L 21/67144; H01L 21/67011; H01L 21/67259; H05K 3/30
See application file for complete search history.

(56) References Cited

U.S. PATENT DOCUMENTS 6,101,709 A * 8/2000 Shiota ................ H05K 13/0061
29/833
6,514,790 B1    2/2003 Plettner et al.
(Continued)

FOREIGN PATENT DOCUMENTS

CN    101341587 A    1/2009
DE    102008052661 A1    4/2010
(Continued)

OTHER PUBLICATIONS

International Search Report and Written Opinion issued in corresponding PCT Patent Application No. PCT/EP2017/059391, dated Jun. 28, 2017.
(Continued)

*Primary Examiner* — Peter Dungba Vo
*Assistant Examiner* — Jeffrey T Carley
(74) *Attorney, Agent, or Firm* — Pillsbury Winthrop Shaw Pittman LLP

(57) ABSTRACT

A pick-and-place tool including a plurality of movable holder structures, and a plurality of pick-and-place structures, each holder structure accommodating two or more of the pick-and-place structures, wherein at least one of the two or more pick-and-place structures of a respective holder structure is able to move along a respective holder structure independently from another at least one of the two or more
(Continued)

pick-and-place structures of the respective holder structure, and wherein each pick-and-place structure includes a pick-up element configured to pick up a donor component at a donor structure and place the donor component an acceptor structure.

20 Claims, 19 Drawing Sheets

(56) References Cited

U.S. PATENT DOCUMENTS

| | | | |
|---|---|---|---|
| 8,633,089 B2 | 1/2014 | Ng et al. | |
| 9,218,995 B2 * | 12/2015 | Cheng | H01L 21/67718 |
| 2002/0040519 A1 * | 4/2002 | Hattori | H05K 13/0061 |
| | | | 29/650 |
| 2004/0020043 A1 * | 2/2004 | Ueno | H01L 21/67144 |
| | | | 29/832 |
| 2004/0109751 A1 * | 6/2004 | Whitcomb | H01L 21/67778 |
| | | | 414/744.1 |
| 2004/0140176 A1 * | 7/2004 | Inoue | H01L 21/68707 |
| | | | 198/441 |
| 2005/0088666 A1 * | 4/2005 | Yakiyama | H05K 13/02 |
| | | | 356/614 |
| 2007/0137031 A1 * | 6/2007 | Bosch | H01L 21/67144 |
| | | | 29/740 |
| 2008/0104831 A1 * | 5/2008 | Haji | H01L 21/67132 |
| | | | 29/833 |
| 2009/0013927 A1 * | 1/2009 | Yamasaki | H01L 21/67173 |
| | | | 118/300 |
| 2010/0089980 A1 | 4/2010 | Maeda | |
| 2010/0175828 A1 | 7/2010 | Fan et al. | |
| 2013/0115752 A1 | 5/2013 | Hwang et al. | |
| 2014/0030849 A1 | 1/2014 | Hwang et al. | |
| 2015/0082620 A1 | 3/2015 | Gustafsson et al. | |

FOREIGN PATENT DOCUMENTS

| | | | |
|---|---|---|---|
| EP | 1174909 A2 * | 1/2002 | H01L 24/81 |
| EP | 1330152 B1 | 7/2003 | |
| JP | 2015026789 A | 2/2015 | |
| KR | 10-2004-0020310 | 3/2004 | |
| KR | 10-2010-0072816 | 7/2010 | |
| KR | 10-2011-0050547 | 5/2011 | |
| KR | 10-2015-0073938 | 7/2015 | |
| TW | 201024191 A | 7/2010 | |

OTHER PUBLICATIONS

Han, Chang-Soo, et al..: "Three-axis lever actuator with flexure hinges for an optical disk system", Review of Scientific Instruments, vol. 73, No. 10, Oct. 2002.
Steengen, An: "Technology Innovation in an IoT Era", IMEC, Semi Taiwan, Jul. 2015.
Korean Office Action issued in corresponding Korean Patent Application No. 10-2018-7036275, dated Apr. 3, 2020.
Korean Notice of Allowance issued in corresponding Korean Patent Application No. 10-2018-7036275, dated Sep. 7, 2020.
Chinese Office Action issued in corresponding Chinese Patent Application No. 201780029700.5, dated Aug. 2, 2021.

* cited by examiner

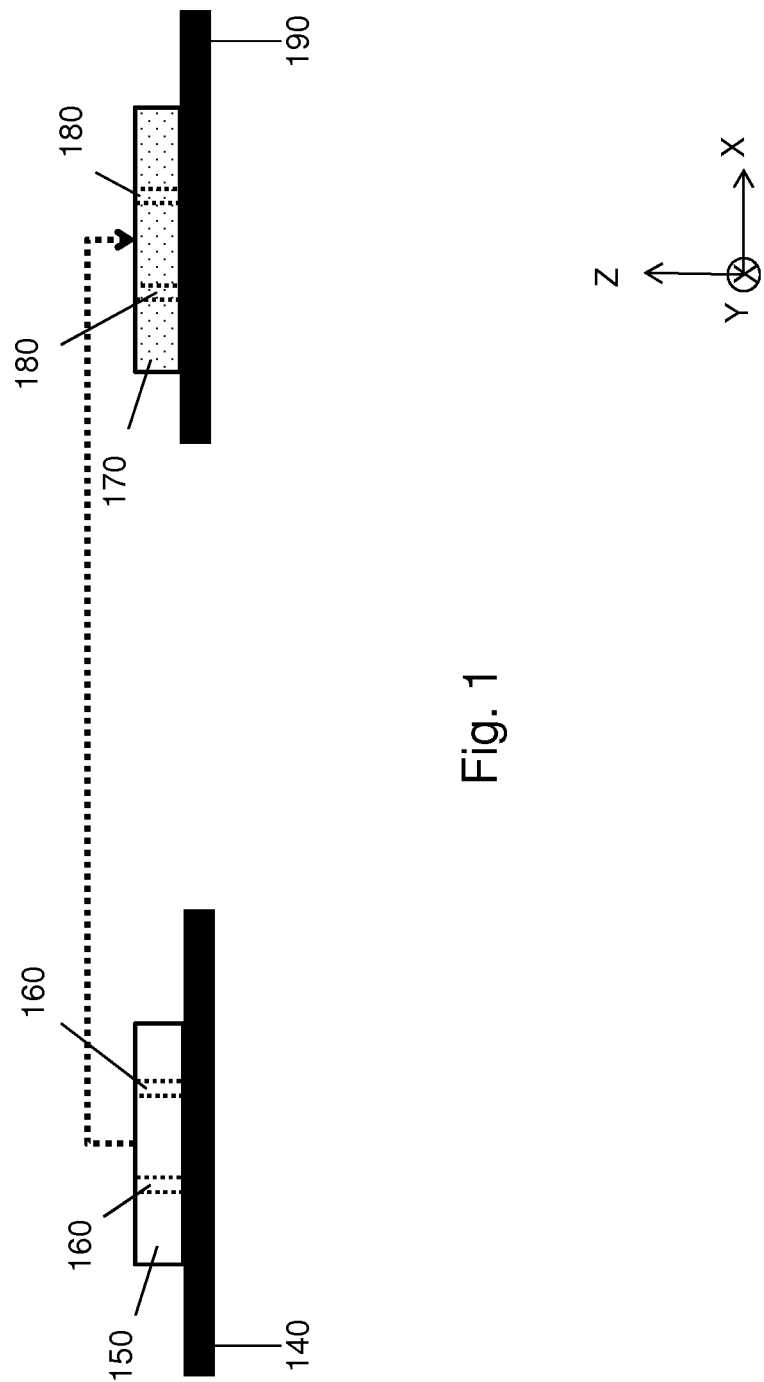

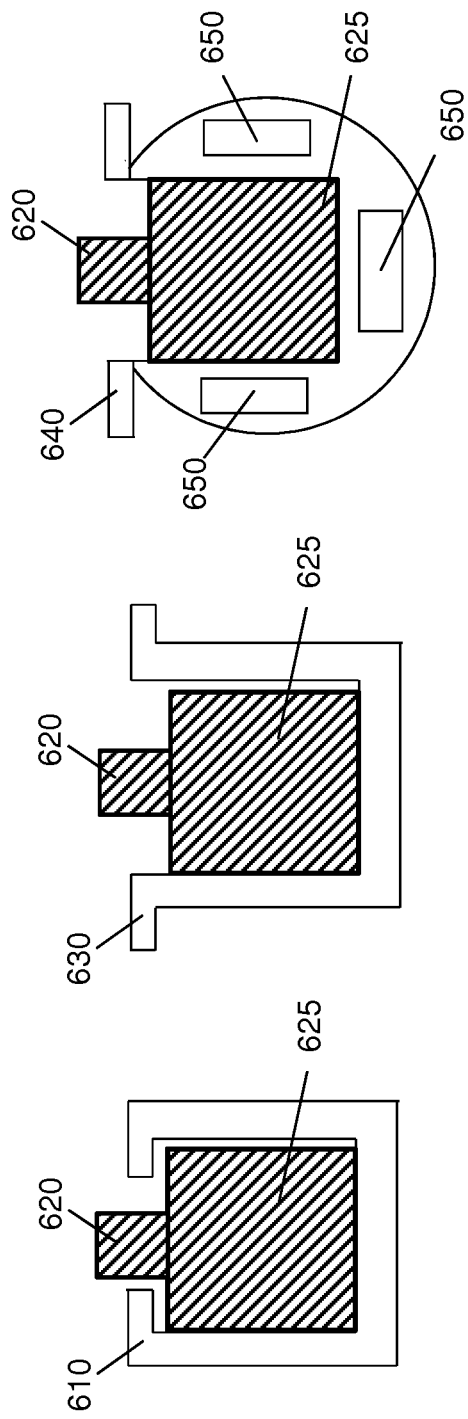

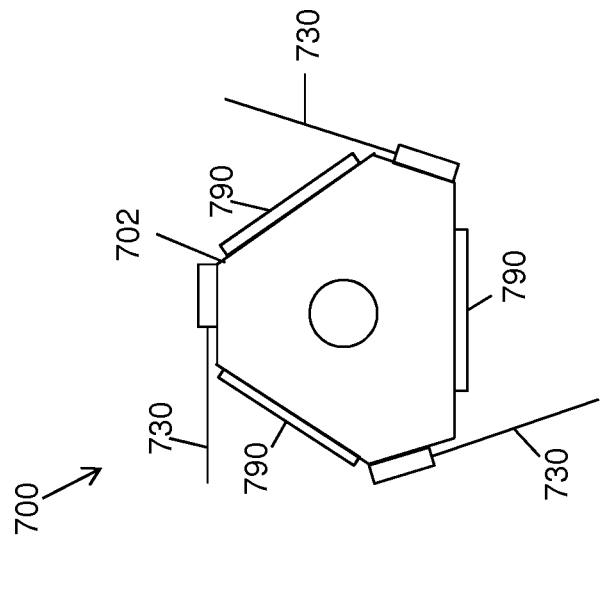
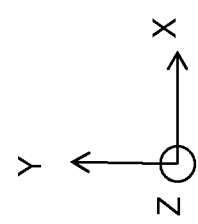
Fig. 7B
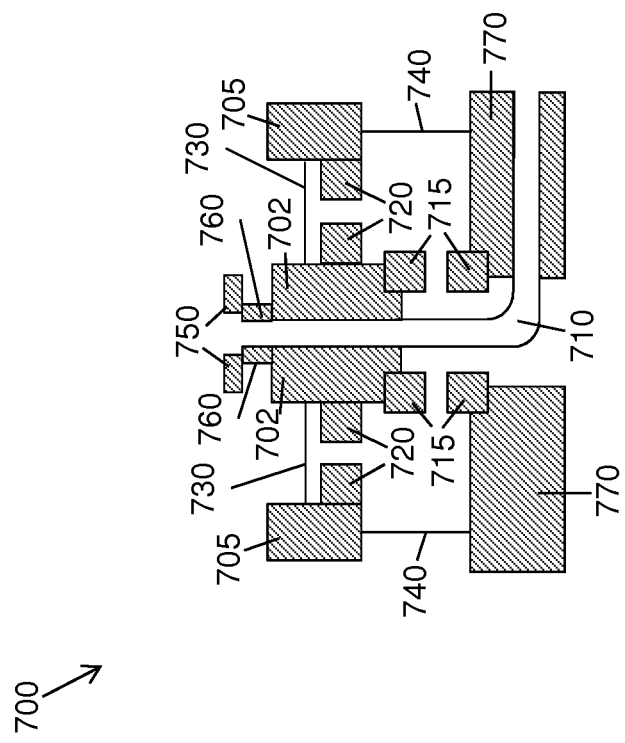
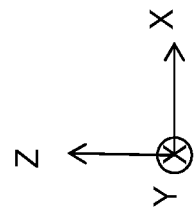
Fig. 7A

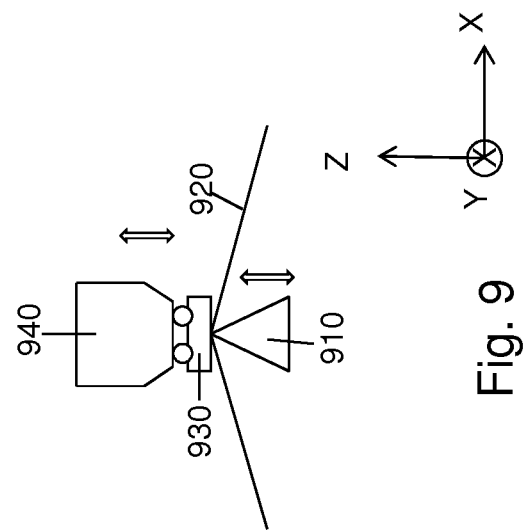
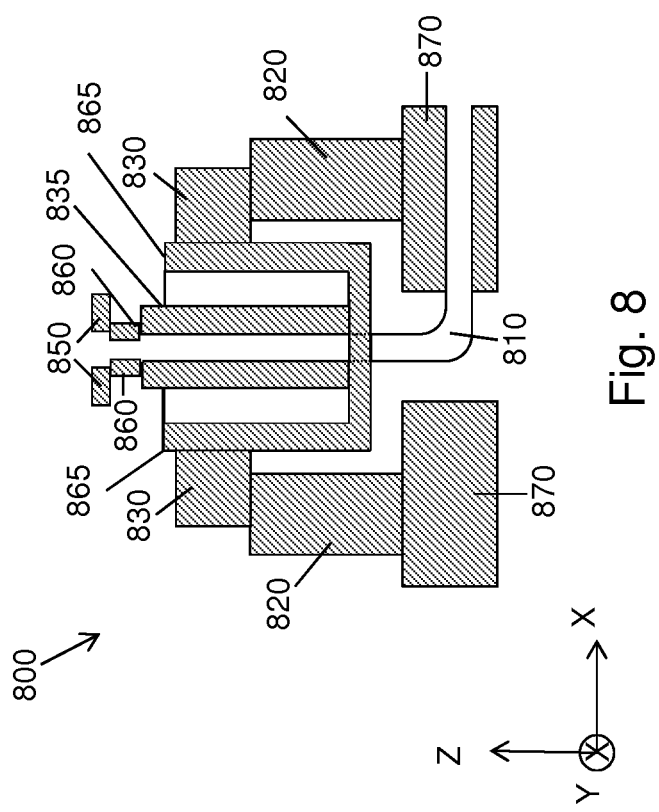
Fig. 9
Fig. 8

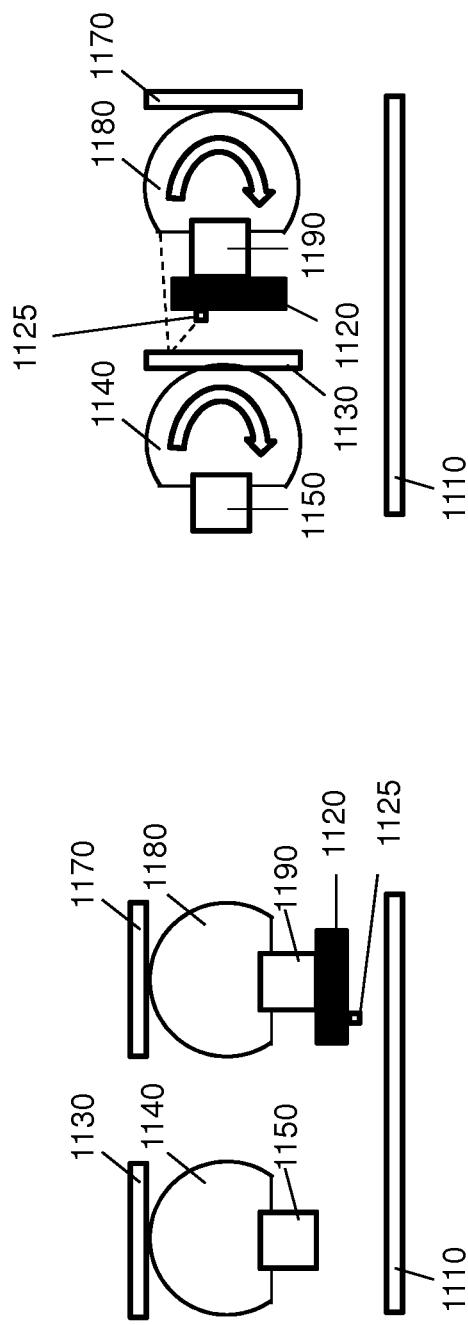

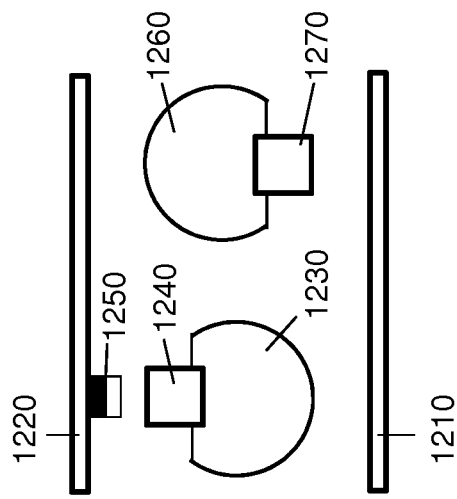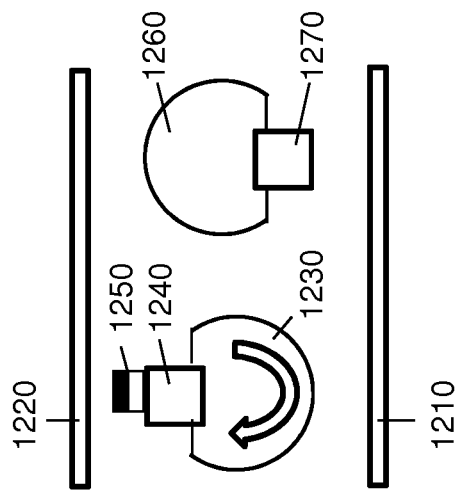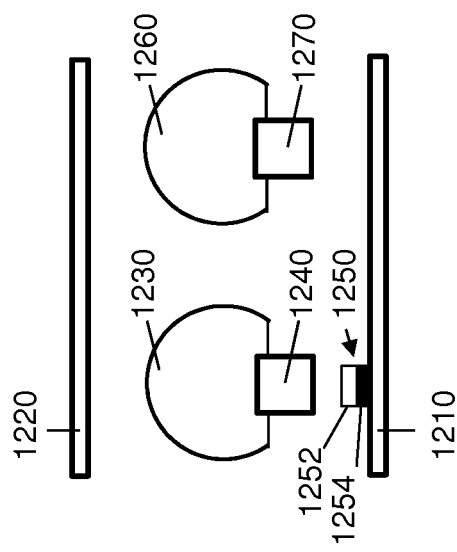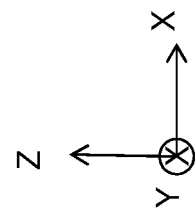

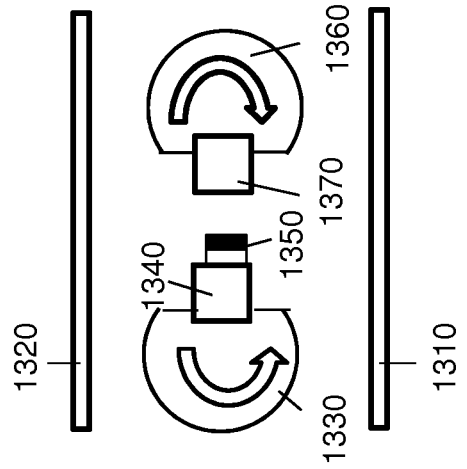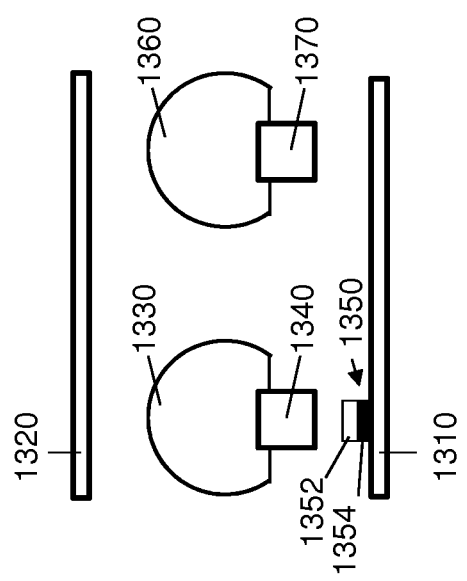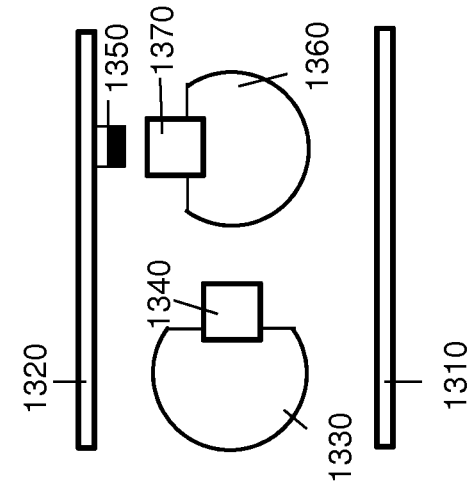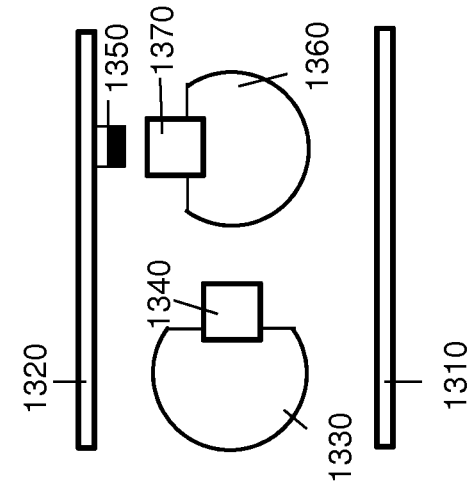

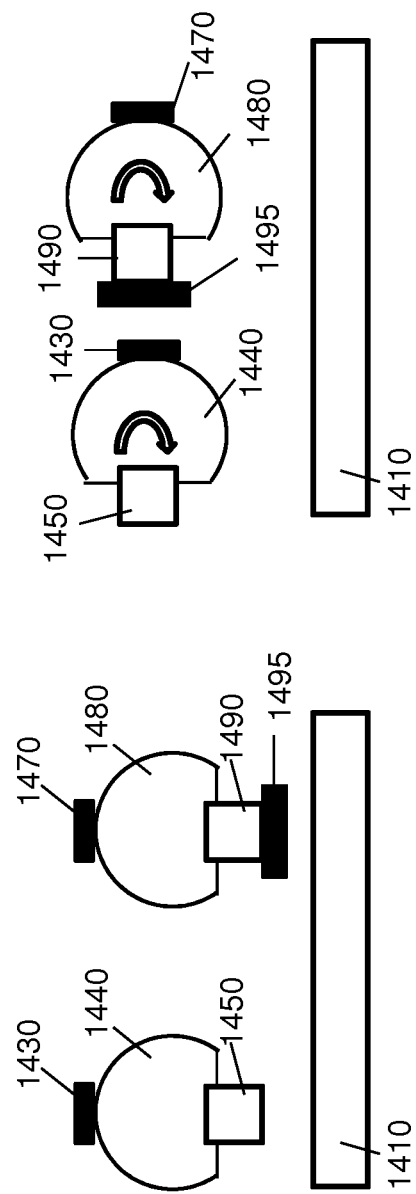

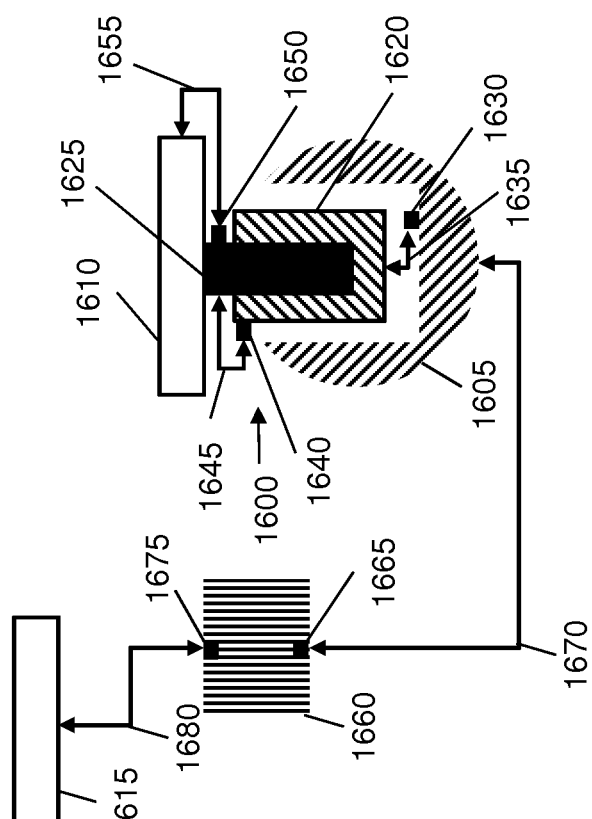
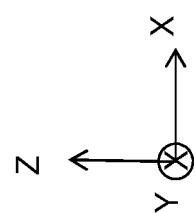
Fig. 16
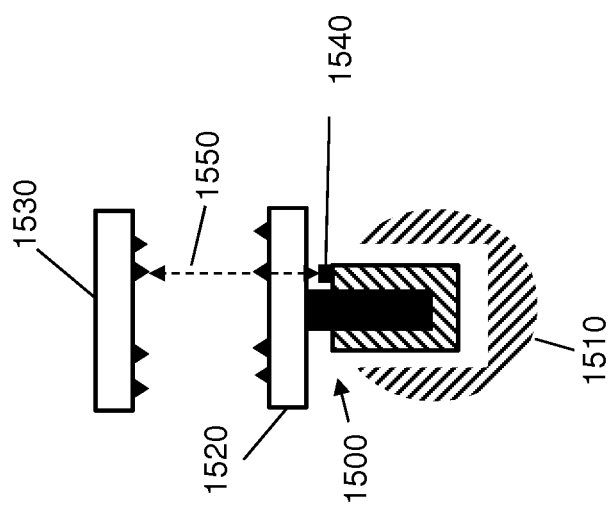
Fig. 15

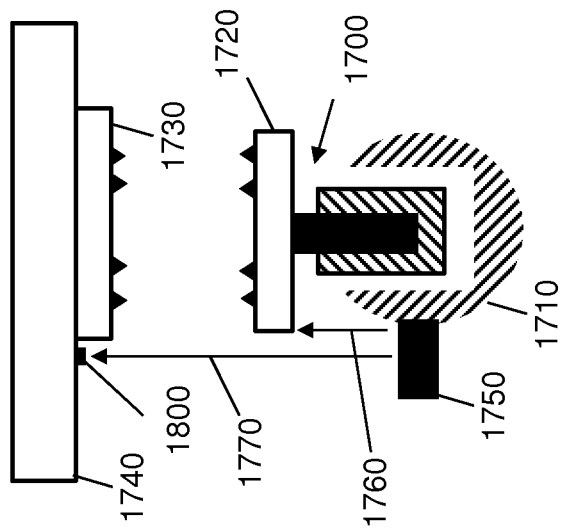
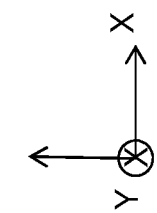
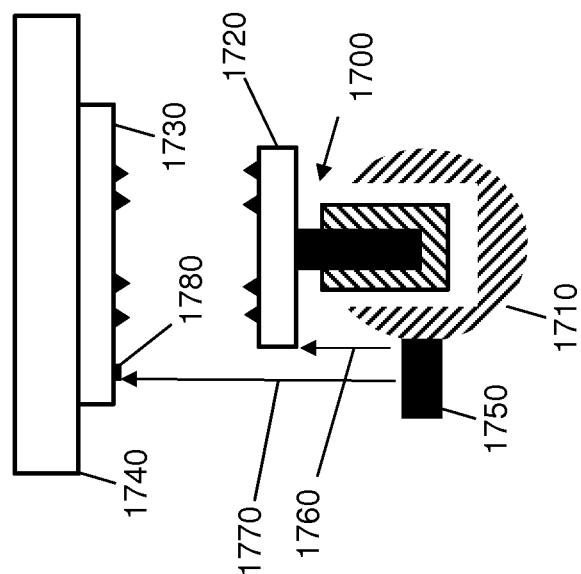
Fig. 17
Fig. 18

PICK-AND-PLACE TOOL HAVING MULTIPLE PICK UP ELEMENTS

CROSS-REFERENCE TO RELATED APPLICATIONS

This application is the U.S. national phase entry of PCT patent application no. PCT/EP2017/059391, which was filed on Apr. 20, 2017, which claims the benefit of priority of European patent application no. 16169553.1, which was filed on May 13, 2016, and which is incorporated herein in its entirety by reference.

FIELD

The present description relates to a method and apparatus for a pick-and-place and/or advanced packaging or stacking, for example, in the manufacture of devices.

BACKGROUND

As part of device manufacturing, e.g., the manufacture of integrated circuits (ICs) and other devices, a lithographic apparatus may apply a desired pattern onto a substrate, usually onto a target portion of the substrate. A patterning device, which is alternatively referred to as a mask or a reticle, used in the lithographic apparatus may be used to provide or generate a pattern (e.g., a circuit pattern or other functional elements of devices, such as microprocessors, memory chips, etc.) to be formed on an individual layer of the device (e.g., IC). This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc. Similar techniques can be used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades. However, creating individual functional elements having smaller dimensions is becoming more challenging. Stacking two or more dies or substrates to form a device may be a technology to increase the amount of functionality per device (and optionally help keep the device cost effective). This technology is sometimes referred to as 3D stacking. In an embodiment, the two or more stacked dies or substrates are connected by through silicon vias (TSVs). By employing 3D stacking technology, the amount of functionality per device may continue to increase without necessarily further shrinking the dimensions of individual functional elements of the device.

SUMMARY

A state of art advanced packaging or stacking tool—a pick-and-place tool—cannot fulfill the requirement of high throughput and high placement accuracy at the same time. As a result, such a pick-and-place tool may be a bottleneck for advanced packaging or stacking due to its low throughput/accuracy and thus may not be suitable for high volume, mass production of devices. Therefore, there is desire for a pick-and-place tool that provides high throughput and/or high alignment accuracy for mass production of devices.

In an embodiment, there is provided a pick-and-place tool comprising: a plurality of movable holder structures; and a plurality of pick-and-place structures, each holder structure accommodating two or more of the pick-and-place structures, wherein at least one of the two or more pick-and-place structures of a respective holder structure is able to move along a respective holder structure independently from another at least one of the two or more pick-and-place structures of the respective holder structure, and wherein each pick-and-place structure comprises a pick-up element configured to pick up a donor component at a donor structure and place the donor component an acceptor structure.

In an embodiment, there is provided a method, comprising: adjusting a distance between at least two pick-and-place structures on a movable holder structure of a plurality of movable holder structures according to orientations of components at a donor structure, wherein the at least two pick-and-place structures are able to move along the holder structure independently and each holder structure accommodates two or more pick-and-place structures; and picking up the donor components using pick-up elements of the at least two pick-and-place structures.

Features and/or advantages of embodiments, as well as the structure and operation of various embodiments, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

FIG. 1 schematically depicts a high level illustration of 3D stacking technology;

FIGS. 6A, 6B, and 6C depict different configurations of a holder structure which holds a pick-and-place structure;

FIG. 7A depicts a schematic side view of a fetcher of a pick-and-place structure;

FIG. 7B depicts a schematic top view of a fetcher of a pick-and-place structure;

FIG. 8 depicts a schematic side view of a fetcher of a pick-and-place structure;

FIG. 9 is a schematic diagram of a component pick-up process and apparatus;

FIGS. 11A and 11B are schematic diagrams of a metrology method and apparatus according to an embodiment;

FIGS. 12A, 12B, and 12C are schematic diagrams of a pick-and-place method and apparatus according to an embodiment;

FIGS. 13A, 13B, 13C, and 13D are schematic diagrams of a pick-and-place method and apparatus according to an embodiment;

FIGS. 14A and 14B are schematic diagrams of a pick-and-place method and apparatus according to an embodiment;

FIG. 15 is a schematic diagram of a metrology method and apparatus according to an embodiment;

FIG. 16 is a schematic diagram of a metrology method and apparatus according to an embodiment;

FIG. 17 is a schematic diagram of a metrology method and apparatus according to an embodiment;

FIG. 18 is a schematic diagram of a metrology method and apparatus according to an embodiment.

DETAILED DESCRIPTION

Figure 2A:
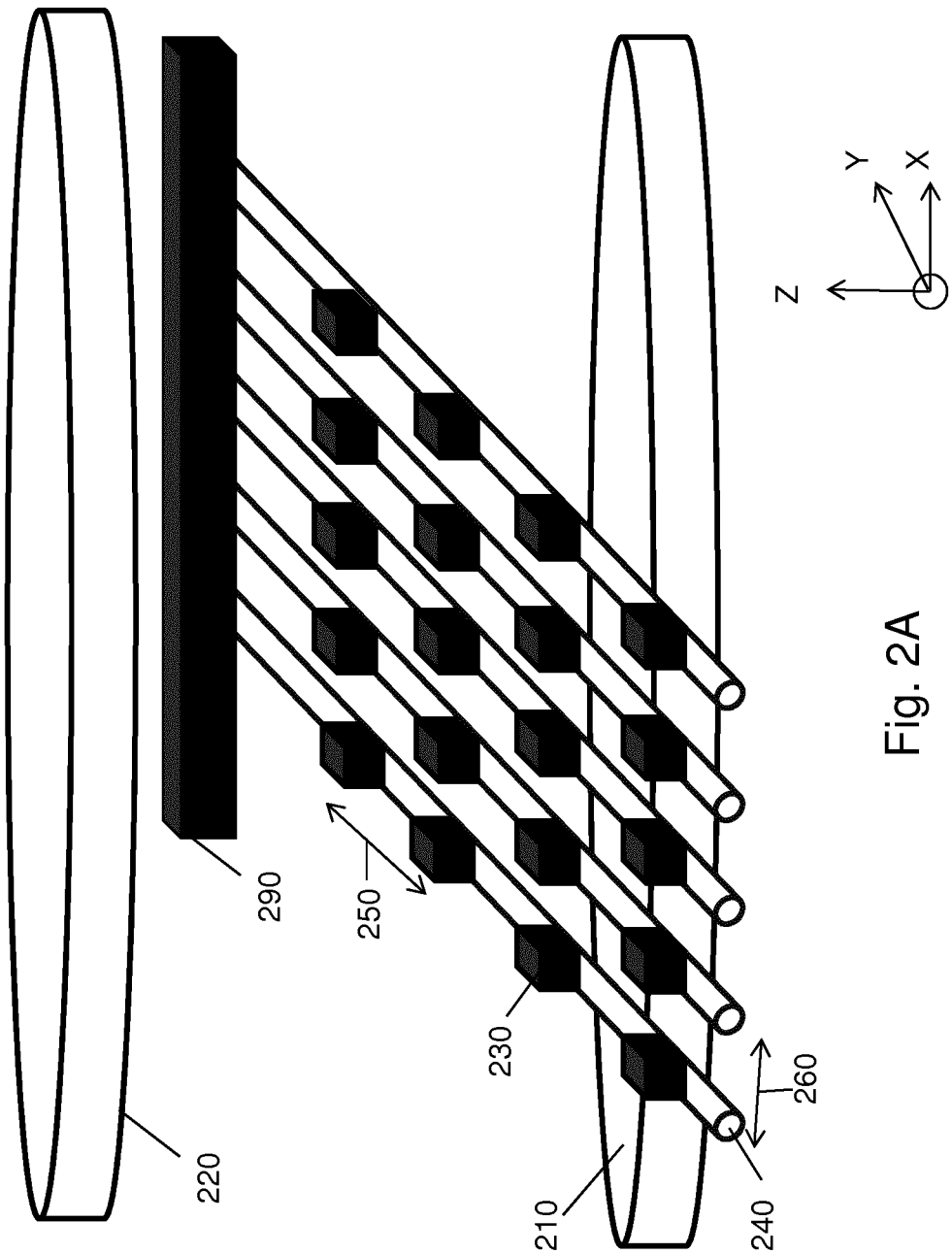
FIGS. 2A, 2B, 2C, and 2D are schematic diagrams of a pick-and-place method and apparatus according to an embodiment.

Before describing embodiments in detail, it is instructive to present an example environment in which embodiments may be implemented.

FIG. 1 schematically depicts a high level illustration of an implementation of an example of advanced packaging or stacking, namely 3D stacking technology using a plurality of dies. A die 150 located on a donor substrate 140 (typically there may be a plurality of dies 150 located on the donor substrate 140), the die 150 comprising one or more first through silicon vias (TSVs) 160. The one or more first TSVs 160 enable electrical contact through or with the die 150. In an embodiment, the cross-section of each first TSV 160 in the X-Y plane has, e.g., a cross-sectional width (e.g., diameter) of about 0.3 μm. Similarly, a die 170 is located on an acceptor substrate 190 (typically there may be a plurality of dies 170 located on the acceptor substrate 190), the die 170 comprising one or more second TSVs 180, which enable electrical contact through or with the die 170. As shown in the embodiment of FIG. 1, the die 150 and the die 170 comprise two first TSVs 160 and two second TSVs 180, respectively. However, the die 150 and the die 170 may comprise another suitable number of first TSVs 160 and second TSVs 180, respectively.

A pick-and-place tool (not shown) may be used to pick up the die 150 of the donor substrate 140, and place the die 150 with (e.g., on, next to, etc.) an associated die 170 of the acceptor substrate 190, as shown by the dotted line, by accurately aligning the first TSVs 160 with the second TSVs 180. As a result, the die 150 is stacked with the die 180 so that, e.g., electricity (e.g., electricity encoded with data) may transmit between the die 150 and the die 170. Such a pick-and-place tool may be, in some embodiments, referred to as a pick-and-place machine. Although FIG. 1 depicts a die-to-die stacking, similar methods may be conducted to perform die-to-substrate stacking, substrate-to-die stacking, or substrate-to-substrate stacking.

The state of art pick-and-place tool may have some technical challenges. For example, the state of the art pick-and-place tool can have relatively low alignment accuracy. The alignment accuracy refers to the accuracy of aligning the TSVs of two dies (e.g., the first TSVs 160 of the die 150 and the second TSVs 180 of the die 170). Since the cross-sectional widths of the first TSVs 160 and the second TSVs 180 may be only 0.3 μm as discussed above, alignment accuracy of 0.1 μm or better may be required for the pick-and-place tool to successfully align the first TSVs 160 with the second TSVs 180. Second, the state of art pick-and-place tool can have a low throughput (e.g., 1 wafer per hour). This is because the packing tool can only pick up one die on the donor substrate (e.g., the die 150) at any given time. Therefore, such a pick-and-place tool may not be suitable for high volume, mass production. As such, there is desire for a pick-and-place tool that provides high alignment accuracy and/or a high throughput.

While the discussion above has focused on a die, the component picked up can be different than a die. In an embodiment, the component comprises an electronic and/or optical structure or device. In an embodiment, the component has a maximum cross-sectional area of less than or equal to 5 cm$^2$, less than or equal to 4 cm$^2$, less than or equal to 3 cm$^2$, less than or equal to 2 cm$^2$, or less than or equal to 1 cm$^2$. In an embodiment, the component has a height of less than or equal to 5 mm, less than or equal to 4 mm, less than or equal to 3 mm or less than or equal to 2 mm. In an embodiment, the component has a maximum cross-sectional dimension of less than or equal to 5 cm, less than or equal to 4 cm, less than or equal to 3 cm, or less than or equal to 2 cm. In an embodiment, the pick-and-place tool has a placement accuracy for the component of less than or equal to 3 microns, less than or equal to 2 microns, less than or equal to 1.5 microns, less than or equal to 1 micron or less than or equal to 0.5 microns.

FIGS. 2A, 2B, 2C, and 2D are schematic diagrams of a pick-and-place method and apparatus according to an embodiment. As shown in FIG. 2A, a plurality of holder structures 240 (e.g., 5 or more, 10 or more, 15 or more, 20 or more, 25 or more, 30 or more, or 40 or more) are provided. In an embodiment, the holder structure is a shaft or a shaft-like structure. While 5 holder structures are shown for convenience, another number of holder structures 240 may be provided. Different configurations of the holder structures 240 will be described in greater detail in FIGS. 6A-6C.

In an embodiment, one or more of the holder structures 240 (desirably a plurality of holder structures 240) are movable by an actuator 290 (e.g., one or more electric motors) in at least one degree of freedom, in at least two degrees of freedom, in at least three degrees of freedom, in at least four degrees of freedom, in at least five degrees of freedom, or in six degrees of freedom. In an embodiment, the one or more holder structures 240 are movable in the X-direction and may optionally have some relatively small movement about the Z-direction. For example, one or more of the holder structures 240 may be capable of rotation, translation, or a combination thereof. In an embodiment, one or more of the holder structures 240 can move with respect to one of more of the other holder structures 240 to accommodate, for example, the different locations of components (e.g., dies) to be picked up or different sizes of components to be picked up. In an embodiment, the movement of one or more of the holder structures 240 is controlled independently. The independent and/or relative movement can be done so that the distance 260 between the holder structures of a pair (desirably of each of a plurality of pairs) of adjacent holder structures 240 may be adjusted in any desired manner to accommodate, for example, the different locations of components to be picked up or different sizes of components to be picked up. In an embodiment, not all holder structures need to be independently controllable and/or capable of relative movement. In an embodiment, the adjacent holder structures 240 are separated with a same distance 260 as shown in FIG. 2A.

In an embodiment, the holder structures are, or become, located between a position of a first structure 210 (e.g., a substrate, such as a donor substrate) and a position of a second structure 220 (e.g., a substrate, such as an acceptor substrate). In an embodiment, to enable the holder structures 240 to become located between the first structure 210 and the second structure 220, the holder structures 240 can be moved as a cluster to a location between the first structure 210 and the second structure 220 and/or away from the location. In an embodiment, the first structure 210 and/or second structure 220 can be moved toward and/or away from the cluster of holder structures 240. In an embodiment, one or more of the holder structures 240 are movable relative to the first structure 210 and/or the second structure 220 when located between the first structure 210 and the second structure 220, e.g., movable in the X-direction relative to the first structure 210 and/or the second structure 220. For example, a group of holder structures 240 can be moved. Such movement can be a change in absolute position, and can be independent of any relative movement between holder structures.

In an embodiment, the first structure 210 is a donor substrate and the second structure 220 is an acceptor substrate, but in another embodiment, the first structure 210 may be an acceptor substrate and the second structure 220 may be a donor substrate. The donor structure 210 and the acceptor structure 220 may be similar to the donor structure 140 and the acceptor structure 190, respectively. For convenience hereinafter, the first structure 210 will be referred to as the donor structure and the second structure 220 will be referred to as an acceptor structure, but in practice it need not be so.

A plurality of pick-up elements 230 (e.g., 5 or more, 10 or more, 15 or more, 20 or more, or 25 or more) are located on each of the holder structures 240 as shown in FIG. 2A. In this embodiment, 4 pick-up elements are shown for convenience, but another number of pick-up elements 230 may be located on the holder structures 240. Further, there may be a different number of pick-up elements on the holder structures 240. Therefore, the pick-up elements 230 may collectively form any desired shape of array such as a rectangular shape, a circular shape, a square shape, a triangular shape, or any other suitable shape. In an embodiment, the shape of the array may match the shape of the donor structure, the acceptor structure, or the arrangement of components (e.g., dies) on the respective structure.

In an embodiment, one or more of the pick-up elements 230 (desirably a plurality of pick-up elements 230) are movable by an actuator (e.g., one or more electric motors) in at least one degree of freedom, in at least two degrees of freedom, in at least three degrees of freedom, in at least four degrees of freedom, in at least five degrees of freedom, or in six degrees of freedom. In an embodiment, the pick-up elements 230 are coarsely movable in the Y-direction, but can have fine motion in 3 or more degrees of freedom. For example, one or more of the pick-up elements 230 may be capable of rotation, translation, or a combination thereof. In an embodiment, one or more of the pick-up elements 230 (desirably a plurality of pick-up elements 230) are moveable along its respective holder structure 240. For example, in an embodiment, a group of pick-up elements 230 can change their absolute position, and can do so irrespective of any relative motion between pick-up elements as discussed hereafter. In an embodiment, one or more of the pick-up elements 230 can move with respect to one of more of the other pick-up elements 230, desirably with respect to one of more of the other pick-up elements 230 on a same holder structure 240. Thus, in an embodiment, a distance 250 between pick-up elements 230 on a same holder structure 240 may be adjusted to accommodate, for example, the different locations of components to be picked up or different sizes of components to be picked up. In an embodiment, the movement of one or more of the pick-up elements 230 is controlled independently. The independent and/or relative movement can be done so that the distance 250 between the pick-up elements of a pair (desirably of each of a plurality of pairs) of adjacent pick-up elements 230 may be adjusted in any desired manner to accommodate, for example, the different locations of components to be picked up or different sizes of components to be picked up. In an embodiment, the pitch between pick-up elements 230 can be different than the pitch between holder structures 240. In an embodiment, not all pick-up elements need to be independently controllable and/or capable of relative movement. In an embodiment, a plurality of pick-up elements 230 may be moved together. In an embodiment, adjacent pick-up elements 230 on the same holder structure 240 are separated with the same distance 250 for all the holder structures 240 as shown in FIG. 2A. In an embodiment, adjacent pick-up elements 230 on a same holder structure 240 are separated with a same distance 250, while adjacent pick-up elements 230 on a different holder structure 240 are separated by a different distance.

Figure 2B:
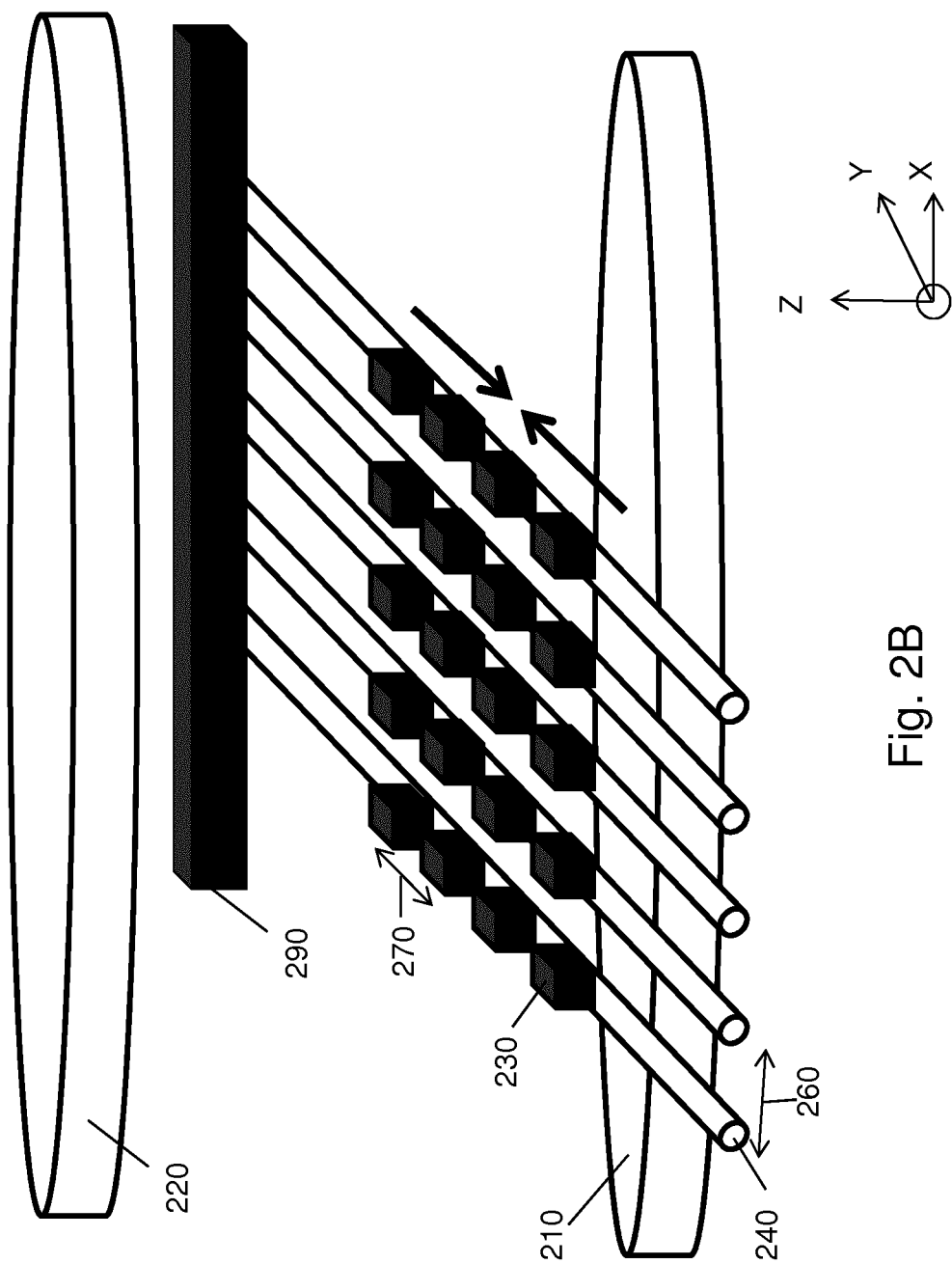
Figure 2C:
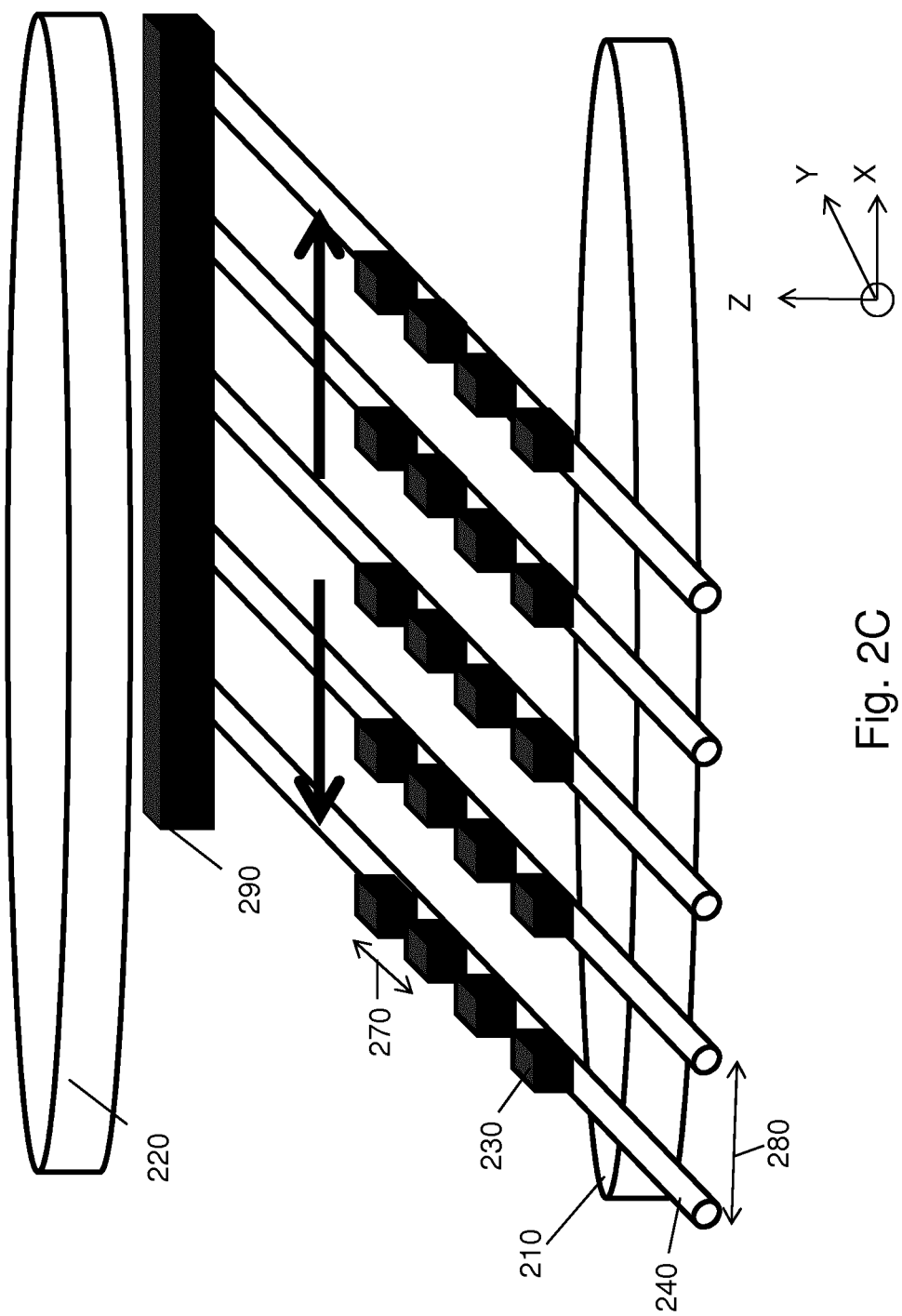

In order to pick up one or more components (e.g., dies) 150 (not shown in FIG. 2) on the donor structure 210, the pick-up elements 230 are arranged by appropriate movement of one or more holder structures 240 and/or one or more pick-up elements 230 according to the orientation of the one or more components 150 on the donor structure 210. For example, components 150 may be situated in a 4×5 rectangular array, in which adjacent rows of the components 150 are separated with a same distance 280 and the adjacent columns of the components 150 are separated with a same distance 270. Accordingly, one or more of the pick-up elements 230 on one or more of the holder structures 240 move along the corresponding holder structure 240 (shown, for example, by the arrows) until the pick-up elements 230 on each of the holder structure 240 are separated with a distance 270 as shown in FIG. 2B. Additionally, one or more of the holder structures 240 move (shown, for example, by the arrows) until the adjacent holder structures 240 are separated by a distance 280 as shown in FIG. 2C.

Figure 2D:
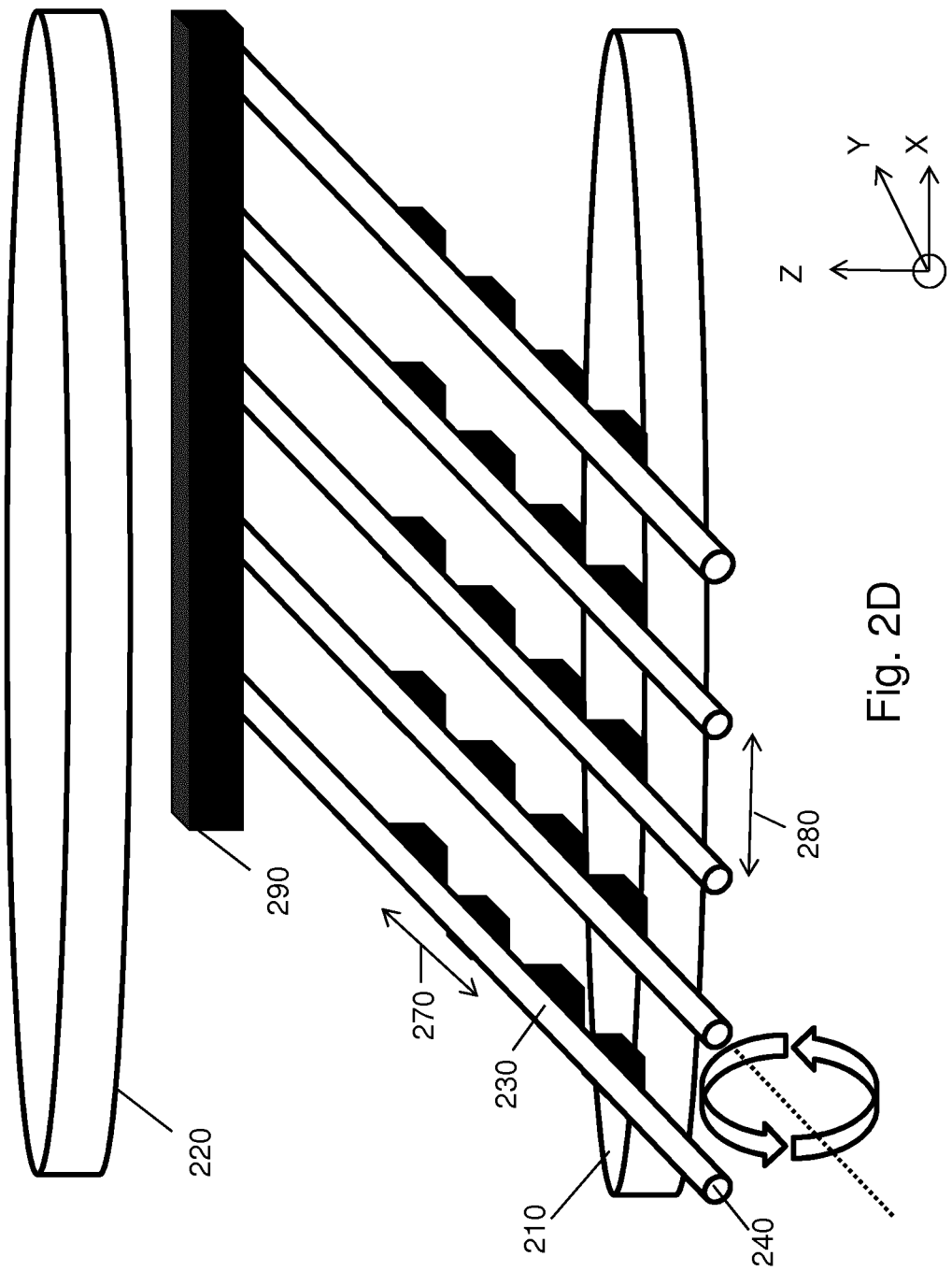

Further, in the example shown in FIG. 2D, the holder structures 240 rotate 180 degrees in either in the clockwise or counterclockwise direction (shown, for example, by the arrows) by the actuator 290 so that the pick-up elements 230 are located to be able to pick up one or more components 150 (desirably a plurality of components 150) on the donor structure 210. In an embodiment, one or more of the holder structures 240 may translate (e.g., vertically down) into proximity with the one or more components 150 on the donor structure 210 so that the pick-up elements 230 may pick up or hold the components. In an embodiment, one or more pick-up elements 230 may move away from its respective holder structure 240 towards one or more components 150 until close enough to pick up or hold one or more components 150 on the donor structure 210. In an embodiment, the donor structure 210 moves toward one or more one or more pick-up elements 230 until close enough to for the pick-up elements 230 to pick up or hold one or more components 150 on the donor structure 210. In an embodiment, there may be any combination of movement of one or more holder structures 240, movement of one or more pick-up elements 230 and/or movement of the donor structure 210, until one or more pick-up elements 230 are close enough for the pick-up elements 230 to pick up or hold one or more components 150 on the donor structure 210. In an embodiment, the holder structures 240 translate toward the components, and the pick-up elements 230 move away from the holder structures 240 toward the components 150, until the pick-up elements 230 can pick up the components 150. Note that picking up a component with a pick-up element as discussed in this application does not necessarily mean that a pick-up element moves toward the component and/or applies a force to move the component away from a structure. Rather, as an example, the component may move toward and in contact with the pick-up element, the pick-up element holds the component in contact therewith and the structure moves away leaving the component behind on the pick-up element.

After the components 150 are picked up, a similar method as described above may be conducted to adjust the distances between adjacent pick-up elements on the same holder structures (e.g., the distance 270) and the distances between adjacent holder structures (e.g., the distance 280) according to the orientation of components 170 of the acceptor structure 220. This is done so that the pick-up elements 230 may stack the components 150 with the components 170 on the acceptor structure 220, desirably with accurate alignment between TSVs of the components 150 and the components 170. Various metrology methods that enable effective alignment are described hereinafter in further detail.

In the above example as shown in FIGS. 2A-2D, the adjacent pick-up elements 230 of the same holder structure 240 are separated with the same distance (e.g., the distances 250 and 270). In some other examples, the adjacent pick-up elements in the same holder structure may be separated with different distances when the components 150 are not evenly spaced on the donor structure and/or the components 170 are not evenly spaced on the acceptor structure. This is because the distances between adjacent pick-up elements depends on the orientation of the components 150 on the donor structure or the orientation of the components 170 on the acceptor structure as described above.

Thus, a typical pick-up and place process can involve rotating the holder structure(s) to generally align with one or more components on a donor structure, moving the pick-up element(s) in the Y direction (if needed), and moving the holder structure(s) in the X direction (if needed) so that the pick-up element(s) are positioned to pick up one or more components. Then, the one or more components are picked up. Then, the holder structure(s) are rotated to generally align with one or components on an acceptor structure and then the pick-up element(s) with the one or more components are moved in the Y direction (if needed) and the holder structure(s) with the one or more components are moved in the X direction (if needed) so that the pick-up element(s) are positioned near the one or components on the acceptor structure. Then, if needed, one or more pick-up elements are moved with fine motion in the X, Y, Rx and/or Ry to, e.g., align TSVs of one or more dies from the donor structure with one or more dies of the acceptor structure. Further, if needed, the one or more pick-up elements are moved with fine motion in the Z direction to place the one or more components from the donor structure with the one or more components of the acceptor structure. After placement, one or more pick-up elements may be moved in the Z direction and then the process is repeated (i.e., rotating the holder structure(s) to generally align with one or more components on a donor structure, etc.).

Figure 3A:
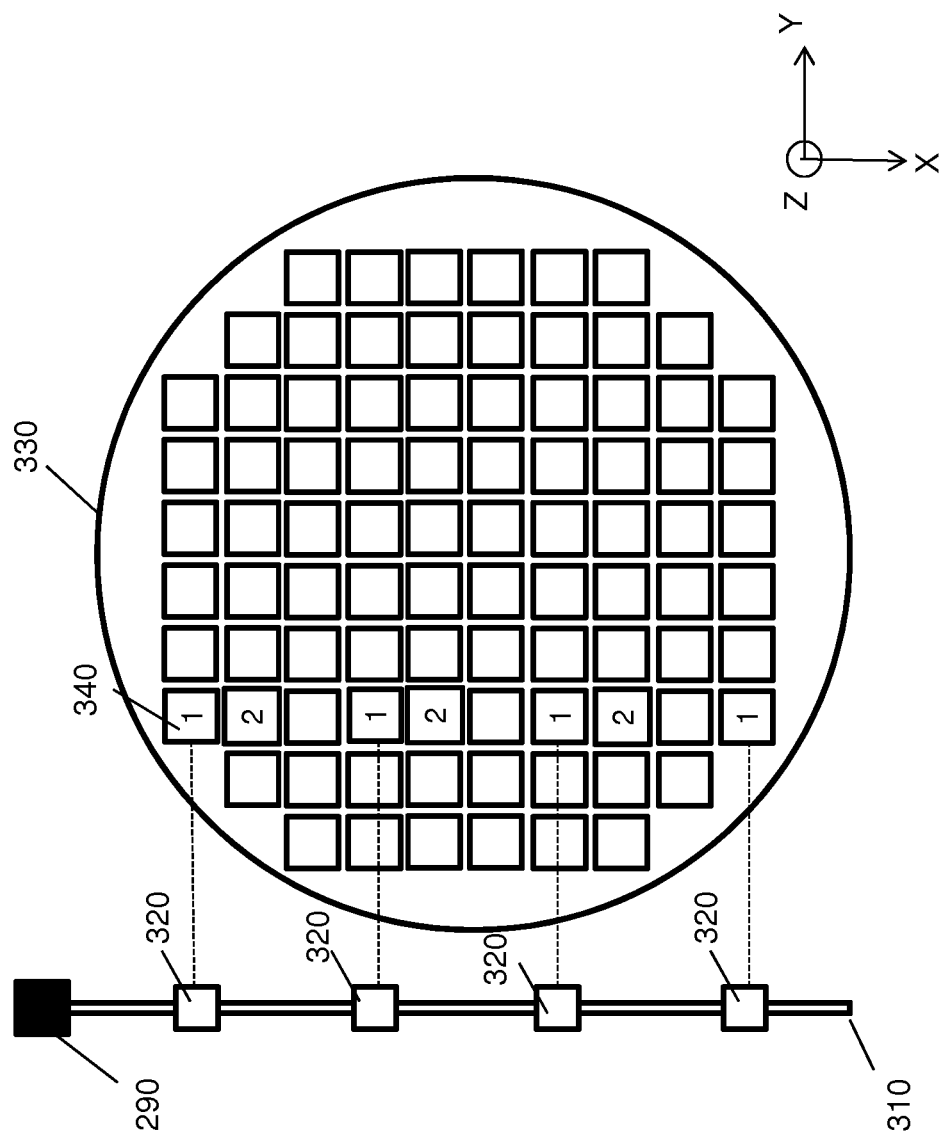
FIGS. 3A and 3B are schematic diagrams of a pick-and-place method and apparatus according to an embodiment.

For example, as shown in FIG. 3A, four pick-up elements 320 are situated on a holder structure 310 with a same distance between adjacent pick-up elements 320 in order to pick up the evenly spaced components 340 marked as "1" on a donor structure 330. The pick-up elements 320, the holder structure 310, and the donor structure 330 may be similar to the pick-up elements 230, the holder structure 240, and the donor structure 210, respectively.

Figure 3B:
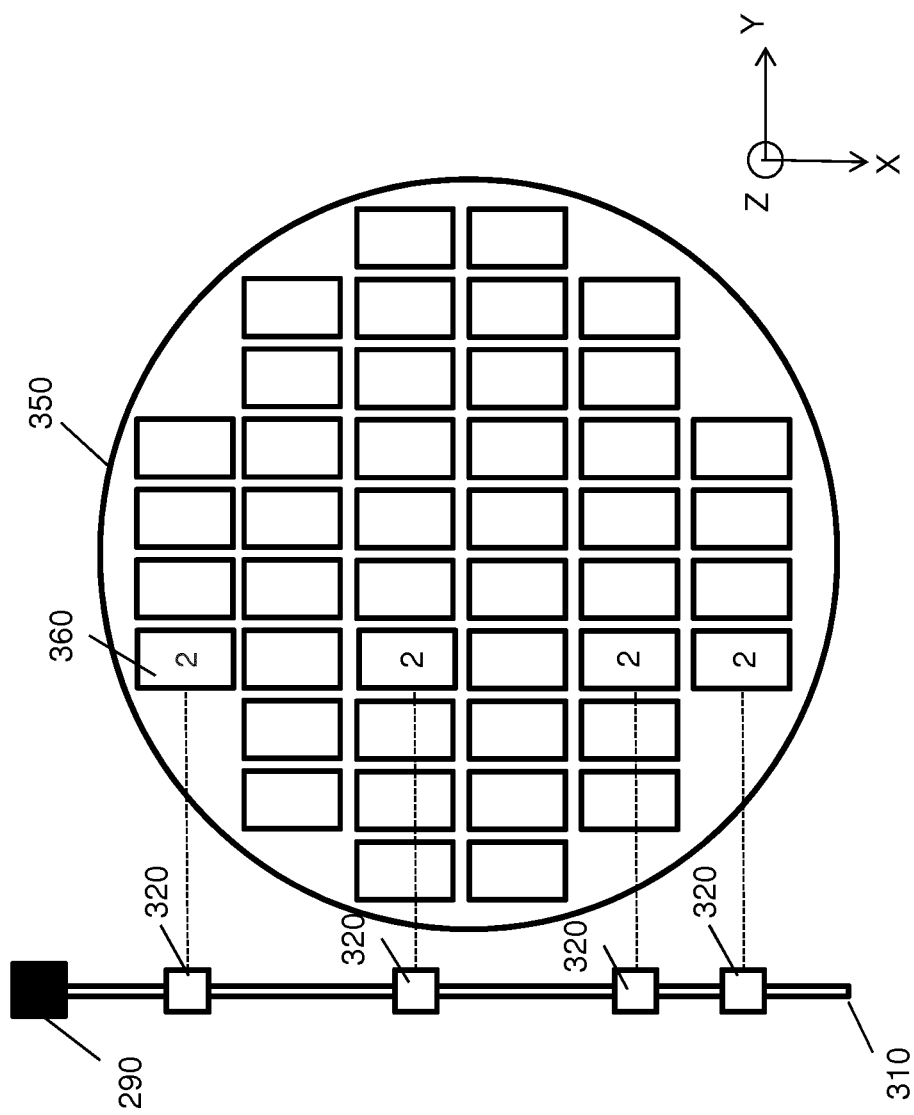

After the components 340 marked as "1" are picked up, one or more of the pick-up elements 320 move along the holder structure 310 as appropriate until the relative positions between the pick-up elements 320 on the holder structure 310 correspond to the locations of the components 360 marked as "2" on the acceptor structure 350 in FIG. 3B. The acceptor structure 350 may be similar to the acceptor structure 220. As shown in FIG. 3B, the pick-up elements 320 are separated with different distances since the components 360 marked as "2" are not evenly spaced on the acceptor structure 350.

Further, for example, as shown in FIG. 3A, in another pick-up operation, three of the four pick-up elements 320 can be situated (e.g., through movement of one or more of the pick-up elements 320) on holder structure 310 in order to pick up the spaced components 340 marked as "2" on a donor structure 330. After the components 340 marked as "2" are picked up, one or more of the pick-up elements 320 may move, if needed, along the holder structure 310 as appropriate until the relative positions between the pick-up elements 320 on the holder structure 310 correspond to the locations of the components 360 marked as "2" on the acceptor structure 350 in FIG. 3B. Thus, the apparatus may enable stacking of components on the top of components already stacked on the acceptor structure 350 or next to already stacked on the acceptor structure 350. In an embodiment, in a pick-up operation, the pick-up elements 320 can pick up only those one or more components indicated as being good.

For the sake of simplicity, only one holder structure 310 and four pick-up elements 320 are shown in FIGS. 3A and 3B. However, other suitable numbers of holder structures 310 may be provided, and the number of pick-up elements 320 per holder structure 310 may be different in other examples. Further, the holder structure 310 is shown to the side of the donor structure 330 and the acceptor structure 350. However, in practice, the holder structure 310 may be located between the donor structure 330 and the acceptor structure 350 like the one or more holder structures 240 shown in FIGS. 2A-2D and may rotate about its axis in the direction of elongation like the one or more holder structures 240 shown in FIGS. 2A-2D. Thus, in this example, the holder structure 310 may only need to be rotated by actuator 290 and not moved laterally by actuator 290.

Figure 4:
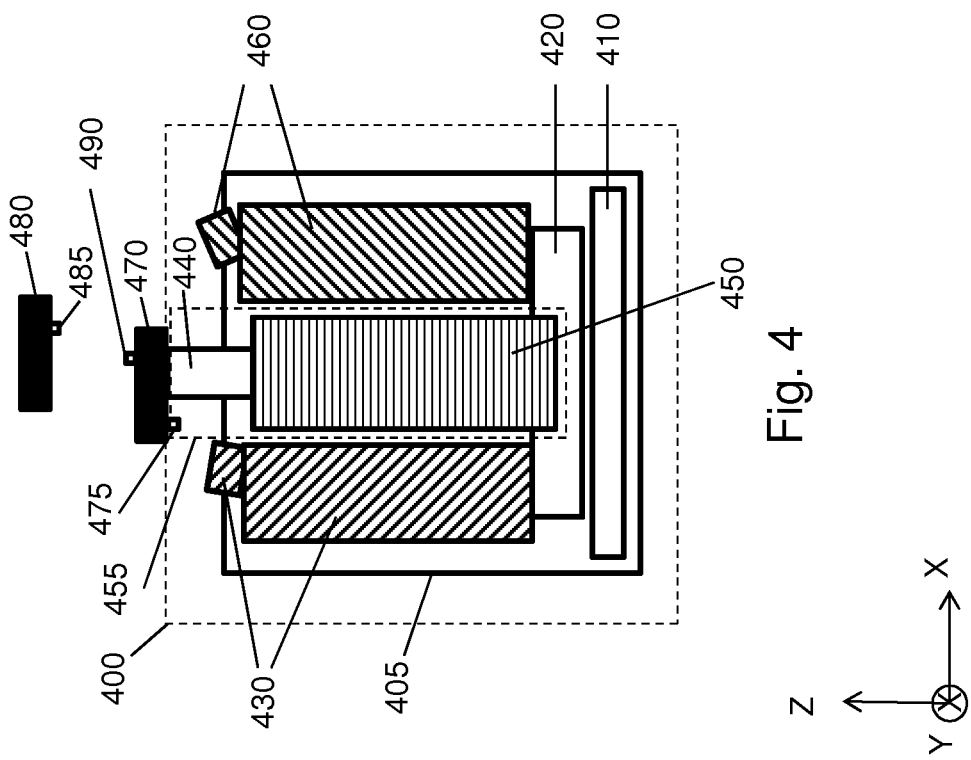
FIG. 4 depicts a schematic side view of a pick-and-place structure according to an embodiment.

FIG. 4 depicts a schematic side view of a pick-and-place structure 400 according to an embodiment. The pick-and-place structure 400 is situated in or on a holder structure (e.g., a holder structure 240, 310), and comprises a pick-up element 440 (similar to pick-up element 230, 320). Different configurations of the holder structure will be described in greater detail with respect to FIGS. 6A-6C.

The pick-up element 440 may be a suction cup, a Van der Waals force clamp, or any other suitable structure that is configured to pick up (e.g., hold or lift) a component 470 from a donor structure (not shown), and/or stack (e.g., hold or push) the component 470 from the donor structure (not shown for convenience) with (e.g., on, next to, etc.) a component 480 on an acceptor structure (not shown for convenience).

In an embodiment, the pick-and-place structure 400 further comprises a position actuator 450 for the pick-up element 440. The position actuator 450 enables the pick-up element 440 to move relative to all or part of the pick-and-place structure 400 (e.g., a piezoelectric actuator). In an embodiment, the position actuator 450 is configured to adjust the position of the pick-up element 440 in up to six degrees, e.g., in the +Z or −Z direction and/or in the X-Y plane. Thus, the position actuator 450 can be used to adjust the position of the pick-up element 440 with respect to the donor structure and/or the acceptor structure, for example, until the pick-up element 440 can pick up the component 470 and/or stack the component 470 with the component 480. In an embodiment, the position actuator 450 can enable the pick-up element 440 to release and/or hold a component thereon. The pick-up element 440 and the position actuator 450 can be collectively referred to as a fetcher 455.

In an embodiment, the pick-and-place structure 400 further comprises a first alignment sensor 430 (e.g., an optical sensor that emits a radiation beam and receives redirected radiation, a capacitive sensor, an acoustic sensor, etc.). The first alignment sensor 430 is configured to determine the relative position of the component 470 with respect to the pick-up element 440. In an embodiment, the first alignment sensor 430 can detect the position by detecting a position of one or more edges of the component 470. In an embodiment, the first alignment sensor 430 can detect the position by detecting a first alignment mark 475 of the component 470. The first alignment mark 475 may be located at any predetermined location on the component 470 (e.g., the front side or edge). In an embodiment, the first alignment mark 475 and/or edge of the component 470 indicates the location of one or more of the first TSVs; that is, the position of the one or more first TSVs is known relative to the first alignment mark 475 and/or edge of the component 470 (e.g., by pre-measurement). Measurement of the edge and/or first alignment mark 475 enables the pick-up element 440 to accurately pick up the component 470 on the donor structure by knowing the accurate position of the component 470 with respect to the pick-up element 440. In an embodiment, the pick-up element 440 is moved by the position actuator 450 based on the measurement.

In an embodiment, the pick-and-place structure 400 further comprises a second alignment sensor 460 (e.g., an optical sensor that emits a radiation beam and receives redirected radiation, a capacitive sensor, an acoustic sensor, etc.). The second alignment sensor 460 is configured to determine the relative position of the component 480 with respect to the pick-up element 440. In an embodiment, the second alignment sensor 460 can detect the position by detecting a position of one or more edges of the component 480. In an embodiment, the second alignment sensor 460 can detect the position by detecting a second alignment mark 485 of the component 480. The second alignment mark 485 may be located at any predetermined location on the component 480 (e.g., the front side or edge). In an embodiment, the second alignment mark 485 and/or edge of the die 480 indicates the location of one or more of the second TSVs; that is, the position of the one or more second TSVs is known relative to the second alignment mark 485 and/or edge of the die 480 (e.g., by pre-measurement). Measurement of the edge and/or the second alignment mark 485 enables the pick-up element 440 to accurately place the component 470 with the component 480 so as to, e.g., accurately align the first TSVs and the second TSVs. In an embodiment, the pick-up element 440 is moved by the position actuator 450 based on the measurement.

In an embodiment, the pick-and-place structure 400 further comprises an electronic control circuit 420. In an embodiment, the electronic control circuit 420 is configured to control the first alignment sensor 430 and/or the second alignment sensor 460. In an embodiment, the electronic control circuit 420 is configured to instruct the position actuator 450 of the amount of position adjustment for the pick-up element 440 based on, e.g., measurement from the first alignment sensor 430 and/or the second alignment sensor 460.

In an embodiment, the pick-and-place structure 400 further comprises an actuator part 410 (e.g., a magnet, a coil, a part to cooperate with an actuator part of the holder structure 240, 310, etc.). The actuator part 410 is located within the pick-and-place structure 400 and is used to enable movement of the pick-and-place structure relative to the holder structure 240, 310 to a desired location. For example, in an embodiment, the actuator part 410 is a magnet that cooperates with one or more electrical coils of the holder structure 240, 310 (e.g., located in at least one of the cavities 650 of the holder structure 640 as shown in FIG. 6C) such that the pick-and-place structure 400 can move relative to the holder structure to a desired location upon application of an appropriate electrical current to the one or more coils. As another example, in an embodiment, the actuator part 410 is an electrical coil that cooperates with one or more magnets of the holder structure 240, 310 (e.g., located in at least one of the cavities 650 of the holder structure 640 as shown in FIG. 6C) such that the pick-and-place structure 400 can move relative to the holder structure to a desired location upon application of an appropriate electrical current to the one or more coils. As another example, in an embodiment, the actuator part 410 is a self-contained actuator (e.g., an ultrasonic motor, a piezoelectric actuator, a rotary motor, etc.) that cooperates mechanically with a part of the holder structure 240, 310 (e.g., a surface, the rack of a rack and pinion, etc.) to move the pick-and-place structure 400 with respect to the holder structure 240, 310. As another example, in an embodiment, the actuator part 410 is a part (e.g., a surface, the rack of a rack and pinion, etc.) that cooperates mechanically with a self-contained actuator (e.g., an ultrasonic motor, a piezoelectric actuator, a rotary motor, etc.) of the holder structure 240, 310 to move the pick-and-place structure 400 with respect to the holder structure 240, 310.

In an embodiment, the pick-and-place structure 400 further comprises a housing 405 to contain the various components. In an embodiment, the housing 405 can provide one or more cooperating surfaces for gas emitted from one or more gas bearings of the holder structure 240, 310. The gas bearing cooperating surface(s) can enable the pick-and-place structure 400 to move relative to the holder structure 240, 310. In an embodiment, the gas bearing cooperating surface is the bottom surface of the housing 405. In an embodiment, the gas bearing cooperating is additionally or alternatively a side surface of the housing 405.

In an embodiment, the component 470 comprises a third alignment mark 490, which may be located at any predetermined location on the back side of component 470 as shown. In an embodiment, the third alignment mark 490 indicates the location of one or more of the first TSVs. As described hereafter, the third alignment mark 490 can be measured with an alignment sensor and the measurement used so that the pick-up element 440 may accurately stack the component 470 on the component 480 by knowing, for example, where one or more of the first TSVs of the die 470 are located with respect to the pick-up element 440 and thus with the die 480 via measurement of the position of die 480 by, e.g., the second alignment sensor 460.

Figure 5:
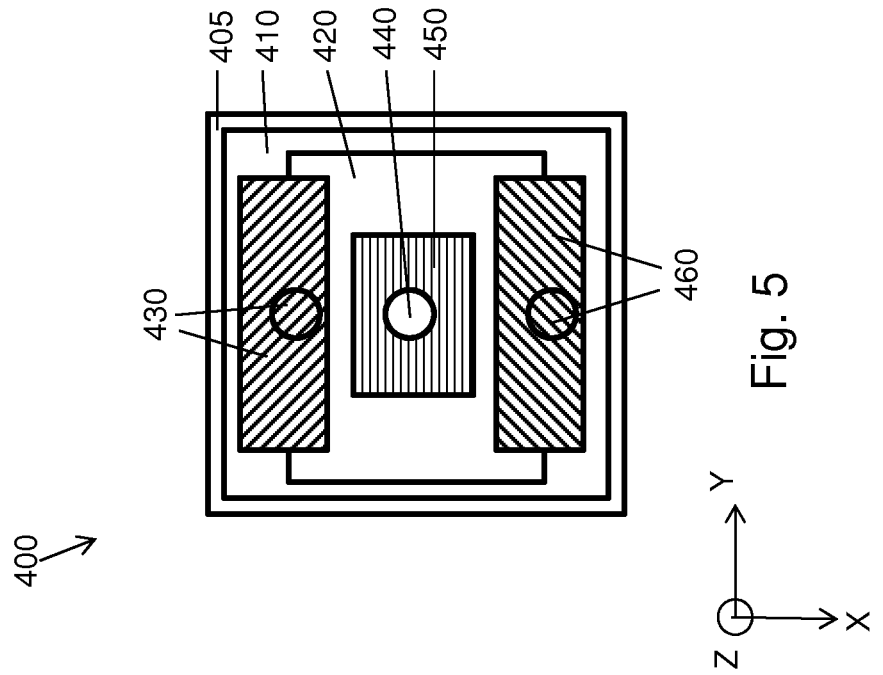
FIG. 5 depicts a schematic top view of a pick-and-place structure according to an embodiment.

FIG. 5 is a schematic top view of the pick-and-place structure 400 according to an embodiment (i.e., without the component 470). As shown, the pick-and-place structure 400 comprises the pick-up element 440. In this embodiment, the pick-and-place structure 400 further comprises the position actuator 450, the first alignment sensor 430, the second alignment sensor 460, the electronic control circuit 420, and the actuator part 410, which are all contained in the housing 405.

FIGS. 6A to 6C depict example different configurations of the holder structure (e.g., the holder structure 240, 310) that accommodates a pick-and-place structure 625. Each pick-and-place structure 625 comprises a pick-up element 620, which is similar to the pick-up elements 230, 320, 440. In an embodiment, the holder structure 610 has a U-shape portion as shown in FIGS. 6A and 6B. In an embodiment, the holder structure 610 further has a portion at a top of the U-shape portion, e.g., a plate, as shown in FIGS. 6A and 6B. The top portion enables increased stiffness (e.g., rotational stiffness) of the holder structure. In FIG. 6A, the top portion extends at least partially inwards and has one or more apertures for the pick-up element 230, 320, 440 (e.g., one or more slots). In an embodiment, the top portion has a plurality of apertures, each aperture corresponding to each of plurality of pick-up elements 230, 320, 440. In FIG. 6B, the holder structure 630 is configured as a flange as shown in FIG. 6B where the top portion extends at least partially outwards (and optionally extends at least partially inwards). In the embodiment of FIG. 6B, a greater range of movement of the pick-up element 230, 320, 440 relative to the opening in the holder structure 630 for the pick-up element can be provided. Additionally or alternatively, the larger opening enables easier replacement of components and/or better serviceability. In an embodiment, as shown in FIG. 6C, the holder structure 640 has a hollow structure with one or more cavities 650 to store, e.g., an actuator part to cooperate with actuator part 410, electrical supply, etc.

As shown in FIGS. 6A-6C, the pick-and-place structure 625 engages at least one surface of the holder structure 610, 630, 640. In particular, in an embodiment, as shown in FIGS. 6A and 6B, the pick-and-place structure 625 engages at least two surfaces to provide a greater constraint of the pick-and-place structure 625; this need not be the case. Further, in an embodiment, as shown in FIG. 6C, the pick-and-place structure 625 engages at least three surfaces to provide a greater constraint of the pick-and-place structure 625; this need not be the case.

There are various embodiments for the fetcher (e.g., the fetcher 455). For the sake of simplicity of description, only a few embodiments of the fetcher are described hereinafter. However, other embodiments of the fetcher may be possible.

In an embodiment, the fetcher (e.g., the fetcher 455) may comprise two stacked DVD pick-up heads as described in Chang-Soo Han and Soo-Hyun Kim, "Three-axis lever actuator with flexure hinges for an optical disk system," Vol. 73, No. 10, Review of Scientific Instruments, October 2002, which is incorporated herein in its entirety by reference, modified for a pick-up element 230, 320, 440. That is, a first DVD pick-up head as described would be used to provide, e.g., Z and X motion and a second DVD pick-up head as described stacked on the first DVD pick-up head to provide, e.g., Z and Y motion, where the second DVD pick-up head has the pick-up element 230, 320, 440.

In an embodiment, a fetcher 700 is schematically depicted in FIGS. 7A and 7B. FIG. 7A depicts a schematic side view of a fetcher 700. As shown, the fetcher 700 comprises a holder element 750 (e.g., a vacuum suction cup) configured as a pick-up element (e.g., the pick-up elements 230). In an embodiment, the fetcher 700 comprises a support 702 to hold a compliance neck 760, where the compliance neck 760 supports the holder element 750 and enables the holder element 750 to slightly move (e.g., pivot). In an embodiment, the compliance neck 760 comprises a rubber grommet. In an embodiment, the fetcher 700 comprises a one or more struts 730 (e.g., 3 struts spaced about equally in the X-Y plane around the support 702) connected between the support 702 and one or more supports 705. The strut(s) 730 holds the support 702 generally in place in the X-Y plane (subject to movement in the X-Y plane by the actuator 715 as described hereafter) but is flexible enough to allow the support 702 to move in the Z-direction. In an embodiment, the strut(s) 730 is a membrane or a wire. In an embodiment, the fetcher 700 further comprises one or more actuators 720. The one or more actuators 720 are configured to adjust the position of the holder element 750 in, e.g., the +Z or −Z direction and/or in a direction (e.g., tilt) about the X or Y direction. In an embodiment, the actuator(s) 720 is a Lorentz actuator.

In an embodiment, the fetcher 700 comprises one or more struts 740 (e.g., 4 struts spaced about equally in the X-Y plane around the support 702) connected between the support 705 and one or more supports 770. The strut(s) 740 holds the support 705 generally in place in the Z direction (subject to movement in the Z direction by the actuator 720) but is flexible enough to allow the support 705 to move in the X-Y plane. In an embodiment, the strut(s) 740 is a membrane or a wire. In an embodiment, the fetcher 700 further comprises one or more actuators 715. The one or more actuators 715 are configured to adjust the position of the holder element 750 in, e.g., the X-Y plane and/or in a direction (e.g., rotation) about the Z direction. In an embodiment, the actuator(s) 715 is a Lorentz actuator.

In an embodiment, the holder element 750 is a low pressure (e.g., vacuum) suction cup. Accordingly, in an embodiment, the fetcher 700 comprises a supply duct 710. The supply duct 710 passes through, e.g., the base support 770, the support 702 and the compliance neck 760. When a low pressure is provided to the supply duct 710, the holder element 750 can hold a component (e.g., the component 340), for example, during the component pick-up process. When the low pressure is released in the supply duct 710, the holder element 750 releases the component (e.g., the component 340) from the holder element 750.

FIG. 7B depicts a schematic top view of a part of the fetcher 700. As shown, the part of the fetcher 700 comprises the holder element 750 and the struts 730 extending from support 702. Further, one or more actuator parts 790 of the one or more actuators 720 are shown. As shown in FIG. 7B, there are actuator parts 790 but a different number can be provided. In an embodiment, the actuator part(s) 790 comprises a motor coil to cooperate with a magnet on support 705 (see FIG. 7A) or comprises a magnet to cooperate with a coil on support 705. Specifically, the actuator part(s) 790 is configured to enable movement of the support 702 in, e.g., the Z axis. The struts 730 hold the support 720 generally in place in the X-Y plane (subject to movement in the X-Y plane by the actuator 715).

In an embodiment, a cross-section of another fetcher 800 is schematically depicted in FIG. 8. As shown, the fetcher 800 comprises a holder element 850 (e.g., a vacuum suction cup) configured as a pick-up element (e.g., the pick-up element 230). The holder element 850 is similar to the holder element 750. The fetcher 800 further comprises a compliance neck 860, a base support 870, and a supply duct 810. The compliance neck 860, the base support 870, and the supply duct 810 are similar to the compliance neck 760, the base support 770, and the supply duct 710.

In an embodiment, the fetcher 800 comprises an actuator 835 (e.g., in the form of tube-like structure) connected to the compliance neck 860 and holder element 850. In an embodiment, the actuator 835 is configured to provide motion in up to 3 degrees of freedom, e.g., X, Y and Z. In an embodiment, the actuator 835 comprises one or more piezoelectric actuators. In an embodiment, the fetcher 800 comprises one or more guides 865, which are configured to guide movement of the actuator 835 and thus movement of compliance neck 860 and holder element 850. In an embodiment, the fetcher 800 comprises one or more mechanical clamps 830, which are configured to hold the one or more guides 865.

In an embodiment, the fetcher 800 comprises one or more actuators 820. In an embodiment, the one or more actuators 820 comprise an inertial slider or walking motor. In an embodiment, the one or more actuators 820 are configured to move the one or more clamps 830 in, e.g., the +Z or −Z direction and/or in a direction (e.g., rotation) about the Z axis. In an embodiment, the one or more actuators 820 are piezoelectric actuators. Thus, when the one or more actuators 820 underneath the one or more clamps 830 move along the Z axis, the holder element 850 moves along the Z axis accordingly.

Similarly as shown in FIG. 7A, the supply duct 810 passes through, e.g., the base support 880. When a low pressure is provided to the supply duct 810, the holder element 850 can hold a component (e.g., the component 340), for example, during the component pick-up process. When the low pressure is released in the supply duct 810, the holder element 850 releases the component (e.g., the component 340) from the holder element 850.

Different combinations of features of the fetcher 800 can be provided. For example, the arrangement of the actuator 835 of FIG. 8 can be replaced and/or combined with the strut and actuator arrangement of FIG. 7.

FIG. 9 is a schematic diagram of a component pick-up process and apparatus. As shown in FIG. 9, a component 930 (e.g., the component 340) is located on a film 920 (e.g., dicing film). The component 930 is aligned with a push-up pin 910 which raises (as shown by the arrow) the component 930 during the component pick-up process from a position where the component 930 and the adjacent film 920 is generally co-planar. When the push-up pin 910 rises to an appropriate level, the component 930 is lifted up while supported by the film 920. In this situation, the component 930 and the film 920 are no longer generally co-planar so as, for example, to enable the component 930 to be more accessible for removal and/or to make the component 930 readily separable from the film 920. The pick-up element 940 is positioned just above the top surface of the removable component 930. In an embodiment, the pick-up element 940 may move toward or away from the component 930 as shown by the arrow. In an embodiment, the pick-up element 940 remains stationary as the push-up pin 910 places the component 930 adjacent the element 940. In an embodiment, both the push-up 910 and pick-up element 940 may move to enable picking up of the component 930. Once the pick-up element 940 and component 930 are next to each other, the pick-up element 940 can hold the component 930 on the pick-up element 940 through, e.g., application of a low pressure. After the component pick-up process, the pick-up element 940 may further transfer the detached component 930 from the film 920 to a corresponding component on an acceptor structure (not shown) for, e.g., 3D stacking.

Determining an accurate position of a component on the donor structure is significant to the component pick-up process so that the position of the component can be determined relative to the pick-up element so that the pick-up element can accurately position the component with a component on an acceptor structure. In an embodiment, as described above, this can be done by detecting an alignment mark (e.g., the alignment mark 475) and/or an edge of the component (e.g., the component 470) on the donor structure using an alignment sensor (e.g., the alignment sensor 430). Additionally, determining an accurate position of a component on the acceptor structure is desirable for, e.g., proper placement of the component from the donor structure with the component of the acceptor structure and/or accurate alignment of TSVs of the die from the donor structure with the die on the acceptor structure. As described above, this can be done by detecting an alignment mark (e.g., the alignment mark 485) and/or the edge of the component (e.g., the component 480) on the acceptor structure with an alignment sensor (e.g., the alignment sensor 460).

When the pick-up element is in, or comes to, close proximity to the donor structure and/or the acceptor structure, it may be difficult to determine an accurate position of the component on respectively the donor structure and/or acceptor structure using the above methods due to the limited field of view of the alignment sensor (e.g., the alignment sensor 430, 460) when in that position. Therefore, a metrology system may be used such as schematically depicted in FIG. 10.

Figure 10:
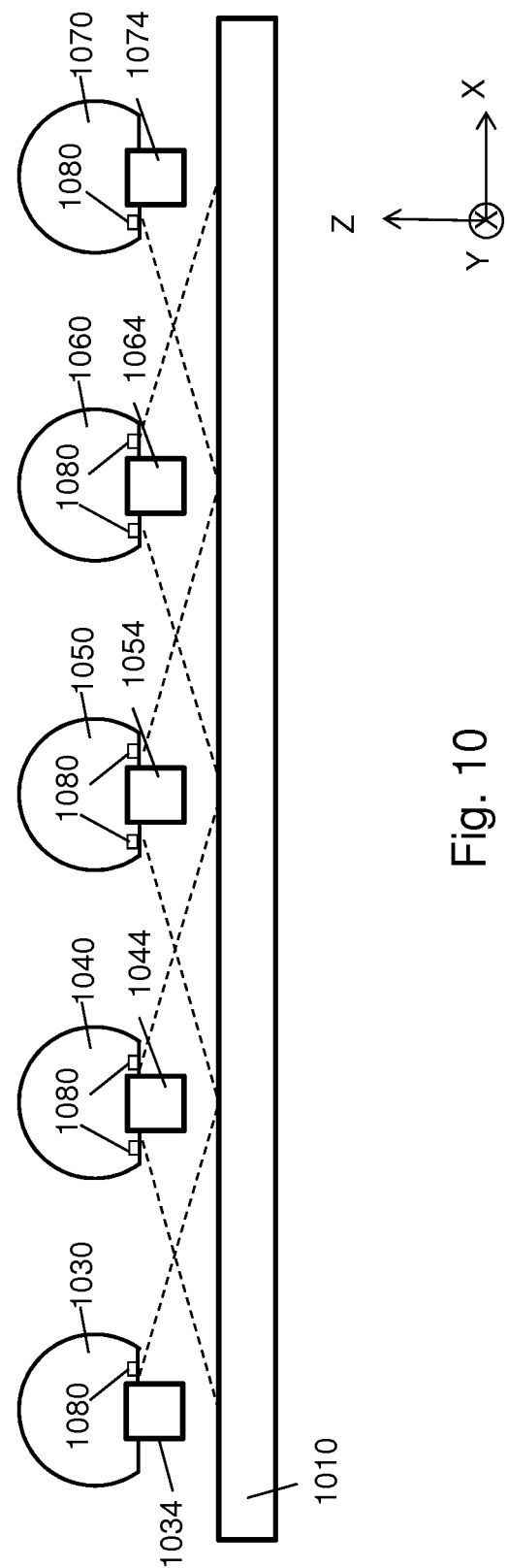
FIG. 10 is a schematic diagram of a metrology method and apparatus according to an embodiment.

FIG. 10 is a schematic diagram of a metrology method and apparatus according to an embodiment. As shown, holder structures 1030,1040,1050,1060, and 1070 are located next to a structure 1010 (e.g., a donor structure or acceptor structure). Although only five holder structures are shown in FIG. 10, other suitable number of holder structures may be provided. On each holder structure, a pick-and-place structure is attached. For simplicity of description, only the pick-up elements of the pick-and-place structures are shown. As will be appreciated, each holder structure may have a plurality of pick-and-place structures and so FIG. 10 shows a side view of a first pick-up element of each holder structure. For example, the pick-up elements 1034, 1044, 1054, 1064, and 1074 on the holder structures 1030, 1040, 1050, 1060, and 1070, respectively are shown in FIG. 10. When one or more of the pick-up elements 1034, 1044, 1054, 1064, and 1074 are in proximity with the structure 1010, the alignment sensor (not shown for convenience) of the corresponding pick-and-place structure may not be able to accurately determine the position of the corresponding component on the structure 1010 due to limited field of view of the metrology system of the pick-and-place structure, e.g., the alignment sensor (e.g., the alignment sensor 430, 460). However, when considering holder structure 1050 and its pick-and-place structure, a metrology system of a pick-and-place structure located in one or more adjacent holder structures, e.g., holder structures 1040 and/or 1060, to holder structure 1050 can be used to determine the position of the target component on the structure 1010 and transmit the information to the electronic control circuit of the pick-and-place structure on the holder structure 1050. Thus, the metrology system of the pick-and-place structure on the holder structure 1050 can determine the position of its target component on the structure 1010 with the aid of one or more metrology systems of pick-and-place structures on one or more adjacent holder structures 1040, 1060. In an embodiment, this is done by using one or more side sensors 1080 (e.g. cameras), which is a part of the metrology system, on one or more of the adjacent pick-and-place structures (e.g., the pick-and-place structure on holder structure 1040 and/or holder structure 1060) configured to determine the position of a respective target component on the structure 1010 for a pick-and-place structure on an adjacent holder structure (e.g., holder structure 1050). The one or more side cameras 1080 may be installed on a pick-up element, or another part of the pick-and-place structure. As a result, the pick-up element 1054 can accurately pick up the target component on the structure 1010. The method may be applied to accurately determine the position of a target component on a donor structure and/or on an acceptor structure. Advantageously, the alignment accuracy between TSVs of a die from a donor structure with a target die of an acceptor structure can be improved.

The front sides or edges of the target components (e.g., the sides that face up to the pick-up elements) are inspected in the above metrology method. Sometimes, further improvement on the alignment accuracy may require that the back side of a target component (e.g., a component from the donor structure) is inspected.

An embodiment of back side inspection is shown in FIG. 11A. Referring to FIG. 11A, a pick-up element 1190 picks up a component 1120 (e.g., component 470) from a structure 1110 (as will be appreciated, the pick-up element 1150 of holder structure 1140 may also pick up a component although that is not shown merely for convenience). After pick up, both the holder structure 1180 and the adjacent holder structure 1140 rotate, e.g., about 90 degrees clockwise as shown in FIG. 11B. Holder structure 1140 carries a reflective mirror 1130; holder structure 1180 also may carry a reflective mirror 1170 for use with a sensor of another holder structure. The mirror 1130 is arranged so that the back side of the component 1120 can be inspected using a sensor (not specifically shown but, for example, alignment sensor 460 or a camera) via the mirror 1130 as shown by the dashed line of FIG. 11B. For example, an alignment mark 1125 (e.g., alignment mark 490) can be measured. As shown in FIG. 11B, both the holder structures 1140 and 1180 rotate 90 degrees clockwise. In some examples, the holder structure 1140, 1180 may rotate a different angle as long as the back side of the component 1120 can be inspected via the mirror 1130. As will be appreciated, the back side of another component (on a holder structure to the right of holder structure 1180—not shown for convenience) can be inspected using the mirror 1170 on the holder structure 1180. Additionally or alternatively, the back side of a component on holder structure 1140 may be inspected using the mirror 1170 carried by the holder structure 1180 after both the holder structures 1140 and 1180 rotate at an appropriate angle (e.g., 90 degrees counterclockwise from the position shown in FIG. 11A). Thus, in an embodiment, the back sides of multiple components can be inspected simultaneously and/or can be done while the component(s) is moved from the donor structure to the acceptor structure (without any or little impact on throughput). With through such inspection, the location of a TSV on the die can be determined for alignment with another die.

FIG. 15 is a schematic diagram of a metrology method and apparatus according to an embodiment. As shown, a pick-and-place structure 1500 is held by a holder structure 1510. The pick-and-place structure 1500 is shown here holding a component 1520 for placing on, or with, a component 1530 at, e.g., an acceptor structure. In this embodiment, the pick-and-place structure 1500 comprises a sensor system 1540 configured to direct radiation (e.g., electromagnetic radiation) 1550 through the component 1520 to component 1530 and receive at least some of the radiation back, and/or to receive radiation passing 1550 through the component 1520 from component 1530 (in which case the radiation may have been provided through the component 1530 from above the component 1530), to enable measurement of the relative position between the component 1520 and the component 1530. Thus, the radiation 1550 can be selected such that it is able to pass through the material of the component 1520 and optionally the component 1530. In an embodiment, the radiation 1550 can be used to measure an alignment mark or a feature, such as a TSV, on the component 1520 and/or component 1530. In an embodiment, the alignment mark is configured to fluoresce in response to the radiation and the sensor system 1540 is configured to measure the fluoresced radiation to enable measurement of the relative position between the component 1520 and the component 1530. In an embodiment, the sensor system 1540 is configured to measure a redirected portion (e.g., redirected by an alignment mark, by a TSV, etc. of the component 1520 and/or component 1530) of the radiation 1550 to enable measurement of the relative position between the component 1520 and the component 1530. The measurement of the relative position between the component 1520 and the component 1530 can enable placing of the component 1520 on, or with, component 1530.

FIG. 16 is a schematic diagram of a metrology method and apparatus according to an embodiment. As shown, a pick-and-place structure 1600 is held by a holder structure 1605. The pick-and-place structure 1600 is shown here holding a component 1610 for placing on, or with, a component 1615 at, e.g., an acceptor structure. In this embodiment, the pick-and-place structure 1600 comprises a housing 1620 (which can comprise the various components such as depicted in FIG. 4) and a movable pick-up element 1625. Further, a sensor system is provided to enable measurement of a position of the component 1610 and the component 1615. In an embodiment, the sensor system is configured to determine a relative position between the component 1610 and the component 1615. In an embodiment, the sensor system comprises a sensor system 1630 configured to determine a relative position 1635 between the housing 1620 and the holder structure 1605. In an embodiment, the sensor system comprises a sensor system 1640 configured to determine a relative position 1645 between the movable pick-up element 1625 and the housing 1620. In an embodiment, the sensor system comprises a sensor system 1640 configured to determine a relative position 1645 between the component 1610 and the movable pick-up element 1625. Thus, through these various measurements, the relative position between the component 1610 and the holder structure 1605 can be determined.

Further, a frame 1660 can be provided that can, e.g., support the holder structure 1605 and/or the component 1615. In an embodiment, the frame 1660 can be mechanically isolated from the holder structure 1605 and/or the component 1615. In an embodiment, the frame 1660 comprises a sensor system 1665 configured to determine a relative position 1670 between the frame 1660 and the holder structure 1605. In an embodiment, the frame 1660 comprises a sensor system 1675 configured to determine a relative position 1680 between the frame 1660 and the component 1615. Thus, through these various measurements, the relative position between the component 1615 and the holder structure 1605 can be determined.

So, since the relative position between the component 1610 and the holder structure 1605 can be determined and the relative position between the component 1615 and the holder structure 1605 can be determined, then the relative position between the component 1610 and the component 1615 can be determined. The measurement of the relative position between the component 1610 and the component 1615 can enable placing of the component 1610 on, or with, component 1615. In an embodiment, the sensor system 1630, 1640, 1650, 1665, and/or 1675 uses radiation to measure its respective position. In an embodiment, one or more further relative positions are employed to arrive at the relative position between the component 1610 and the component 1615 (e.g., a measurement of a relative position between component 1615 and an acceptor substrate holding component 1615). In an embodiment, the sensor system 1630, 1640 and/or 1665 could be provided on another component than shown. For example, the sensor system 1630 could be provided on the housing 1620. Further, where appropriate and possible, components of the sensor system 1630, 1640, 1650, 1665, and/or 1675 could be provide on more than one components. For example, the sensor system 1630 could have a detector on the housing 1620 and an output for radiation on the holder structure 1605. In an embodiment, the sensor system 1630, 1640, 1650, 1665, and/or 1675 can have an alignment mark on an applicable component to enable position measurement.

FIG. 17 is a schematic diagram of a metrology method and apparatus according to an embodiment. As shown, a pick-and-place structure 1700 is held by a holder structure 1710. The pick-and-place structure 1700 is shown here holding a component 1720 for placing on, or with, a component 1730 at, e.g., an acceptor structure 1740. Further, a sensor system 1750 is provided on the holder structure 1720 and is configured to determine a relative position between the component 1720 and the component 1730. In an embodiment, the same sensor system 1750 is configured to measure both the component 1720 and the component 1730. For example, the sensor system 1750 is configured to provide, and measure, radiation 1760 directed at the component 1720 to determine a position of the component 1720. Similarly, the sensor system 1750 is configured to provide, and measure, radiation 1770 directed at the component 1730 to determine a position of the component 1730. To enable the measurement, the component 1730 can have an alignment mark 1780 onto which the radiation 1770 is directed. So, from these measurements, a relative position between the component 1720 and the component 1730 can be determined. This relative position can be used to accurately position the component 1720 on, or with, the component 1730.

FIG. 18 is a schematic diagram of a metrology method and apparatus according to an embodiment. As shown, a pick-and-place structure 1700 is held by a holder structure 1710. The pick-and-place structure 1700 is shown here holding a component 1720 for placing on, or with, a component 1730 at, e.g., an acceptor structure 1740. Further, a sensor system 1750 is provided on the holder structure 1720 and is configured to determine a relative position between the component 1720 and the component 1730. In an embodiment, the same sensor system 1750 is configured to measure both the component 1720 and the component 1730. For example, the sensor system 1750 is configured to provide, and measure, radiation 1760 directed at the component 1720 to determine a position of the component 1720. Similarly, the sensor system 1750 is configured to provide, and measure, radiation 1770 directed at the component 1730 to determine a position of the component 1730. To enable the measurement, the acceptor structure 1740 can have an alignment mark 1800 onto which the radiation 1770 is directed. This can be used in an arrangement where the component 1720 and the component 1730 have a same width. Of course, knowledge of the relative position between the alignment mark 1800 and the component 1730 would be used to arrive at the relative position between the component 1720 and the component 1730. So, from these measurements, a relative position between the component 1720 and the component 1730 can be determined. This relative position can be used to accurately position the component 1720 on, or with, the component 1730.

In FIGS. 17 and 18, the beams are shown as being directed at substantially perpendicular to the components 1720 and 1730. This need not be the case. Moreover, the components of the sensor system 1750 could be provided at more than one location. For example, a radiation output of the sensor system 1750 could be provided at a first location and the detector of the sensor system 1750 could be provided a second, different location. This could be useful where the radiation is provided at an angle. In an embodiment, the sensor system 1750 can have one or more alignment marks on applicable components to enable position measurement. For example, alignment mark could be provided on component 1720. In an embodiment, the sensor system 1750 could be provided on another component than shown. For example, the sensor system 1750 could be provided on a housing of pick-and-place structure 1700. In an embodiment, the sensor system 1750 could be located at a different position and/or orientation. For example, the sensor system 1750 could be provided adjacent the component 1720 in the Y-direction (e.g., such that it is adjacent a side of the component 1720 that extends in the X-direction). This could be used with one or more radiation beams at a non-perpendicular angle. In an embodiment, the sensor system 1750 in this embodiment could have a radiation output at a first side of the component 1720 and a radiation detector, displaced in the Y-direction from the radiation output, at an opposite second side of the component 1720.

Further, in an embodiment, a sensor system (not shown in FIG. 16, 17 or 18) is provided to determine the position of an alignment feature on the component 1615, 1730 relative to a feature of the component 1615, 1730 measured by the sensor system 1675, 1750. An example of such a sensor system will be described in respect of FIGS. 19A, 19B and 19B. The alignment feature on the component 1615, 1730 can be, e.g., a TSV, an alignment mark, etc. This relative position can be used to accurately position an alignment feature of the component 1610, 1720 on, or with, the alignment feature of the component 1615, 1730 so that the component 1610, 1720 can be accurately positioned on, or with, the component 1615, 1730. Similarly, in an embodiment, a sensor system (not shown in FIG. 16, 17 or 18) is provided to determine the position of the alignment feature on the component 1610, 1720 relative to a feature of the component 1610, 1720 measured by the sensor system 1650, 1750. An example of such a sensor system will be described in respect of FIGS. 19A, 19B and 19B. The alignment feature on the component 1610, 1720 can be, e.g., a TSV, an alignment mark, etc. This relative position can be used to accurately position the alignment feature of the component 1610, 1720 on, or with, the alignment feature of the component 1615, 1730 so that the component 1610, 1720 can be accurately positioned on, or with, the component 1615, 1730.

Figure 19C:
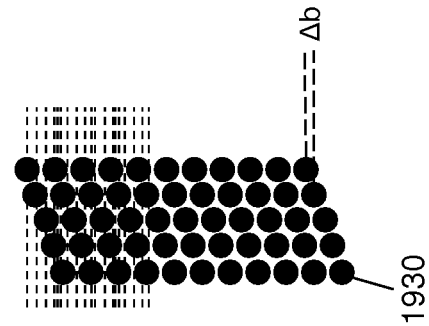
FIGS. 19A, 19B and 19C are schematic diagrams of a metrology method and apparatus according to an embodiment.
Figure 19B:
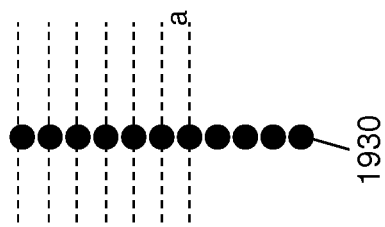
Figure 19A:
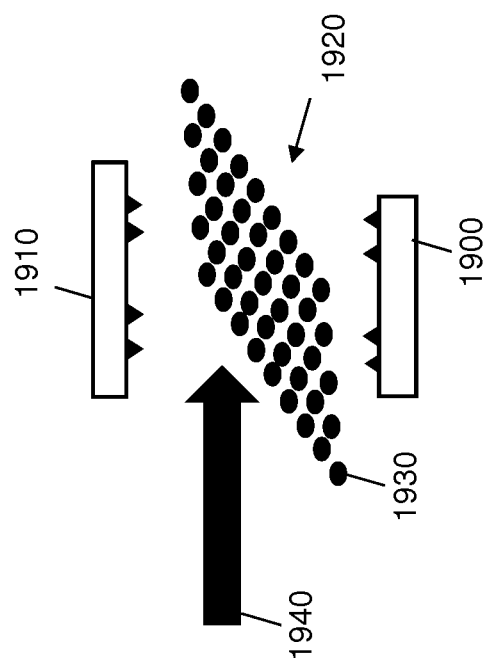

FIG. 19A is a schematic diagram of a metrology method and apparatus according to an embodiment. As shown, a sensor system 1920 is shown located adjacent component 1900 (e.g., donor component) and/or component 1910 (e.g., acceptor component). The sensor system 1920 is configured to measure the position of one or more elements (e.g., one or more of features (e.g., TSVs)) on the component 1900, 1910 to determine the relative position of the one or more features to a portion of the respective component 1900, 1910 measured by another sensor system. For example, the sensor system 1920 can determine a relative position between a feature on a front side of the component 1900, 1910 to a feature on the side or back side of the component 1900, 1910. In an embodiment, the sensor system 1920 can be an image sensor or a camera type system to obtain an image of the component 1900, 1910. In an embodiment, the sensor system 1920 comprises at least one detector 1930. In an embodiment, the sensor system comprises a plurality of detectors 1930 arranged in an array (e.g., a two-dimensional array). To enable the measurement, there can be provided relative movement 1940 between the sensor system 1920 and the component 1900, 1910. For example, the sensor system 1920 can be moved relative to the component 1900, 1910. Additionally or alternatively, the sensor system 1920 can measure an initial position of the component 1900, 1910, e.g., relative to a structure holding the component 1900, 1910. Moreover, where a structure holds a plurality of components 1900, 1910, the sensor system 1920 can, additionally or alternatively, measure initial positions of the components 1900, 1910, e.g., relative to the structure.

As shown in FIG. 19B, the sensor system 1920 can comprise an array of detectors 1930 at a pitch a. In an embodiment, the detectors 1930 can be arranged in a line. As shown in FIG. 19C, the sensor system 1920 can comprise an array of detectors 1930 arranged in a two-dimensional array. In an embodiment, the array can comprise a plurality of rows, each having detectors 1930 at a pitch a. In an embodiment, the rows of detectors 1930 can be offset at a pitch Δb as shown in FIG. 19C. In this way, the measurement resolution can be increased from the pitch a of a single row of detectors 1930 to effectively Δb, as indicated by the dotted lines.

Before a component from a donor structure is stacked with a component on an acceptor structure, it may be desirable to provide a method and apparatus of selecting which side of the component (either the front side or the back side) from the donor structure that is stacked with the component of the acceptor structure. In an example, it is desirable to stack the back side 1254 of a component 1250 on the donor structure 1210 on a component on the acceptor structure 1220 as shown in FIGS. 12A-12C. For clarification, the front side of the component 1250 is marked as 1252. As shown in FIG. 12A, the holder structure 1230 comes into proximity with the component 1250 on the donor structure 1210 so that the pick-up element 1240 is able to pick up the component 1250, e.g., after accurately determining the position of the component using a metrology method as described above. After the component 1250 is picked up or held by the pick-up element 1240, the holder structure 1230 rotates 180 degrees as shown in FIG. 12B and brings the component 1250 in proximity with a component (not shown) on the acceptor structure 1220 (e.g., after accurately determining the position of the component on the acceptor structure 1220 using a metrology method as described above). The pick-up element 1240 thus stacks the back side 1254 of the component 1250 on the component of the acceptor structure 1220 as shown in FIG. 12C by, e.g., aligning the TSVs of the component 1250 with those of the component on the acceptor structure 1220. During this process, only the holder structure 1230 and the pick-up element 1240 need to be involved in transferring the component 1250 from the donor structure 1210 to the acceptor structure 1220. The adjacent holder structure 1260 and the pick-up element 1270 on the adjacent holder structure 1260 are not involved in the process of transferring component 1250 (although it can be involved in transfer of its own component).

In an example, it is desirable to stack the front side 1352 of a component 1350 on the donor structure 1310 with a component on the acceptor structure 1320 as shown in FIGS. 13A-13D. The back side of the component 1350 is marked as 1354. As shown in FIG. 13A, the holder structure 1330 comes into proximity with the component 1350 on the donor structure 1310 so that the pick-up element 1340 is able to pick up the component 1350, e.g., after accurately determining the position of the component 1350 using a metrology method as described above. After the component 1350 is picked up and held by the pick-up element 1340, the holder structure 1330 rotates 90 degrees as shown in FIG. 13B. The adjacent holder structure 1360 also rotates 90 degrees such that the pick-up element 1370 of holder structure 1360 faces the pick-up element 1340 of holder structure 1330 as shown. Then, the pick-up element 1340 passes the component 1350 to the pick-up element 1370 of holder structure 1360 by having the pick-up element 1340 and pick-up element 1370 come into proximity with each other. As shown in FIG. 13C, the holder structure 1360 continues to rotate 90 degrees and provides the component 1350 to near a component (not shown) on the acceptor structure 1320. The pick-up element 1370 stacks (e.g., after accurately determining the position of the component on the acceptor structure using a metrology method as described above) the front side 1352 of the component 1350 with the component on the acceptor structure 1320 as shown in FIG. 12D (which can include, e.g., aligning the TSVs of the die 1350 with those of the die on the acceptor structure 1320). Thus, to transfer the component 1350, at least two adjacent holder structures (i.e., the holder structures 1330 and 1360) and pick-up elements (i.e., pick-up elements 1340 and 1370) are involved in transferring the component 1350 from the donor structure 1310 to the acceptor structure 1320. Metrology of the transferred component (so that its position can be accurately determined for placement with a component on an acceptor structure) can be performed using, e.g., a mirror on an adjacent holder structure as described above in respect of FIG. 11.

In an embodiment, to enable attaching a component from the donor structure to a component on the acceptor structure, various methods may be used. For example, a heating and/or pressure process may be applied when the components are stacked to enable them to remain attached. In an embodiment, the components may be attached to each other using glue (which glue may enable permanent attachment or temporal attachment until another attaching process is employed, e.g., heating and/or pressure). FIGS. 14A and 14B schematically depict a pick-and-place method and apparatus using glue according to an embodiment. As shown in FIG. 14A, a pick-up element 1490 on a holder structure 1480 has picked up a component 1495 from a donor structure 1410. In this embodiment, an adjacent holder structure 1440 carries a glue dispenser 1430 used to dispense glue; similar to the holder structure 1440, holder structure 1480 can carry a glue dispenser 1470 to dispense glue on a component of another holder structure. The pick-up element 1450 of the adjacent holder structure 1440 may or may not pick up a component on the donor structure 1410.

As shown in FIG. 14B, both the holder structure 1480 and the adjacent holder structure 1440 rotate 90 degrees so that the glue dispenser 1430 on the adjacent holder structure 1440 is close enough to the component 1495 on holder structure 1480 to dispense glue on the side of the component 1495 facing the glue dispenser 1430. Further, the holder structure 1480 may rotate a further 90 degrees so that component is proximity with an acceptor structure (not shown for convenience). The pick-up element 1490 can then stack the component 1495 having the glue with a component at the acceptor structure.

In an embodiment, the tool comprises one or more control systems to enable performance of the various operations. The control systems comprise hardware, software or a combination thereof. For example, the control system can comprise a hardware processor combined with a data storage medium having instructions configured to perform the operations.

In an embodiment, there is provided a pick-and-place tool comprising: a plurality of movable holder structures; and a plurality of pick-and-place structures, each holder structure accommodating two or more of the pick-and-place structures, wherein at least one of the two or more pick-and-place structures of a respective holder structure is able to move along a respective holder structure independently from another at least one of the two or more pick-and-place structures of the respective holder structure, and wherein each pick-and-place structure comprises a pick-up element configured to pick up a donor component at a donor structure and place the donor component an acceptor structure.

In an embodiment, one or more holder structures are configured to rotate about an axis of elongation of the holder structure. In an embodiment, one or more holder structures are configured to rotate relative to another one or more holder structure. In an embodiment, one or more holder structures are configured to translate. In an embodiment, one or more of the holder structures are configured to translate relative to another one or more of the holder structures. In an embodiment, one or more of the holder structures are configured to move independently from another one or more of the holder structures. In an embodiment, the tool comprises a control system configured to provide a pitch between pick-and-place structures along a respective holder structure different than a pitch between holder structures. In an embodiment, the tool comprises a control system configured to control a pitch between pick-and-place structures and/or between holder structures to accommodate different sizes of donor components. In an embodiment, one of more of the pick-and-place structures comprise an alignment sensor configured to determine the position of the donor component at the donor structure. In an embodiment, one of more of the pick-and-place structures comprise an alignment sensor configured to determine the position of an acceptor component at acceptor structure. In an embodiment, the tool further comprises a push-up pin configured to push a donor component at donor structure in an upwards direction for pick up by a pick-up element. In an embodiment, one or more of the pick-and-place structures comprises a positioner configured to move the pick-up element relative to another part of the pick-and-place structure. In an embodiment, one or more of pick-and-place structures further comprise a side camera configured to determine the position of a donor component for pick-up by an adjacent pick-and-place structure. In an embodiment, one or more of the holder structures has a glue dispenser configured to dispense glue on a donor component held by a pick-up element of an adjacent holder structure. In an embodiment, one or more of the holder structures has a mirror configured to assist inspection of a back side of a donor component held by a pick-up element of an adjacent holder structure. In an embodiment, the tool comprises a control system configured to move a pick-and-place structure along its holder structure until the relative position of the pick-and-place structure is arranged according to an orientation of a donor component at the donor structure. In an embodiment, the tool comprises a control system configured to move a holder structure relative to another holder structure until a pick-and-place structure is arranged according to an orientation of a donor component at the donor structure. In an embodiment, the tool comprises a control system configured to stack a back side of a donor component with a donor component at the acceptor structure. In an embodiment, the tool comprises a control system configured to: after pick up of a donor component with a pick-up element, pass the donor component to a pick-up element of an adjacent pick-and-place structure; move one or more of the holder structures to in proximity with the acceptor structure; and stack a front side of the donor component with an acceptor component at the acceptor structure. In an embodiment, the tool comprises a control system configured to: determine a position of a donor component of a first pick-and-place structure by an adjacent second pick-and-place structure; and transmit the determined position to the first pick-and-place structure. In an embodiment, the donor component comprises a die. In an embodiment, the acceptor structure comprises a die. In an embodiment, the donor structure comprises a donor substrate and the acceptor structure comprises an acceptor substrate. In an embodiment, the tool further comprises a sensor system configured to measure a relative position between the donor component and the acceptor structure using radiation passing through the donor component. In an embodiment, the tool further comprises a sensor system configured to determine a relative position between the donor component and the acceptor structure by measuring a relative position between the donor component and another structure and between the another structure and the acceptor structure. In an embodiment, the tool further comprises a sensor system located on a holder structure and configured to both measure the donor component and the acceptor structure. In an embodiment, the tool further comprises a sensor system configured to measure a feature of the donor component and/or the acceptor structure relative to another feature of the same donor component and/or acceptor structure.

In an embodiment, there is provided a method, comprising: adjusting a distance between at least two pick-and-place structures on a movable holder structure of a plurality of movable holder structures according to orientations of components at a donor structure, wherein the at least two pick-and-place structures are able to move along the holder structure independently and each holder structure accommodates two or more pick-and-place structures; and picking up the donor components using pick-up elements of the at least two pick-and-place structures.

In an embodiment, adjusting the distance between the at least two pick-and-place structures comprises moving at least one of the at least two pick-and-place structures along the holder structure until the relative positions of the at least two pick-and-place structures are arranged toward an orientation of the donor components at the donor structure. In an embodiment, the method further comprises moving the holder structure relative to another holder structure of the plurality of holder structures until the relative positions of the at least two pick-and-place structures are arranged toward an orientation of the donor components at the donor structure. In an embodiment, the method further comprises moving one or more of the holder structures independently from another one or more of the holder structures. In an embodiment, the method comprises providing a pitch between pick-and-place structures along the holder structure different than a pitch between holder structures. In an embodiment, the method comprises controlling a pitch between pick-and-place structures and/or between holder structures to accommodate different sizes of donor components. In an embodiment, the method further comprises inspecting a front side or edge of a donor component before picking up the donor component. In an embodiment, the method further comprises inspecting a back side of a donor component with the aid of a mirror carried by an adjacent holder structure. In an embodiment, the method further comprises moving one or more of the holder structures to in proximity with an acceptor structure, and stacking a back side of a donor component with an acceptor component at the acceptor structure. In an embodiment, the method further comprises, after picking up a donor component with a pick-up element, passing the donor component to a pick-up element of an adjacent pick-and-place structure; moving one or more of the holder structures to in proximity with an acceptor structure; and stacking a front side of the donor component with an acceptor component at the acceptor structure. In an embodiment, the method further comprises dispensing glue on a donor component held by a pick-up element of an adjacent pick-and-place structure. In an embodiment, the method further comprises determining a position of a donor component of a first pick-and-place structure by an adjacent second pick-and-place structure; and transmitting the determined position to the first pick-and-place structure. In an embodiment, the donor component comprises a die. In an embodiment, the acceptor structure comprises a die. In an embodiment, the donor structure comprises a donor substrate and the acceptor structure comprises an acceptor substrate. In an embodiment, the method further comprises measuring a relative position between the donor component and the acceptor structure using radiation passing through the donor component. In an embodiment, the method further comprises determining a relative position between the donor component and the acceptor structure by measuring a relative position between the donor component and another structure and between the another structure and the acceptor structure. In an embodiment, the method further comprises measuring both the donor component and the acceptor structure using a sensor system located on the holder structure. In an embodiment, the method further comprises measuring a feature of the donor component and/or the acceptor structure relative to another feature of the same donor component and/or acceptor structure.

In an embodiment, there is provided a non-transitory computer readable storage medium storing machine-readable instructions, wherein when executed, the machine-readable instructions cause the processor system to perform any of the methods described herein.

While specific embodiments have been described above, it will be appreciated that the invention may be practiced otherwise than as described. For example, an embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The data storage medium can be any medium that participates in providing instructions to a hardware processor for execution. Such a medium may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic or light waves, such as those generated during radio frequency (RF) and infrared (IR) data communications. Common forms of data storage media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, and a carrier wave (e.g., an electric or optical signal which carries data), are exemplary forms, or any other medium from which a computer can read.

The embodiments may further be described using the following clauses:

1. A pick-and-place tool comprising:
    a plurality of movable holder structures; and
    a plurality of pick-and-place structures, each holder structure accommodating two or more of the pick-and-place structures, wherein at least one of the two or more pick-and-place structures of a respective holder structure is able to move along a respective holder structure independently from another at least one of the two or more pick-and-place structures of the respective holder structure, and wherein each pick-and-place structure comprises a pick-up element configured to pick up a donor component at a donor structure and place the donor component an acceptor structure.
2. The tool of clause 1, wherein one or more holder structures are configured to rotate about an axis of elongation of the holder structure.
3. The tool of clause 2, wherein one or more holder structures are configured to rotate relative to another one or more holder structure.
4. The tool of any of clauses 1 to 3, wherein one or more holder structures are configured to translate.
5. The tool of clause 4, wherein one or more of the holder structures are configured to translate relative to another one or more of the holder structures.

6. The tool of clause 4 or clause 5, wherein one or more of the holder structures are configured to move independently from another one or more of the holder structures.

7. The tool of any of clauses 1 to 6, comprising a control system configured to provide a pitch between pick-and-place structures along a respective holder structure different than a pitch between holder structures.

8. The tool of any of clauses 1 to 7, comprising a control system configured to control a pitch between pick-and-place structures and/or between holder structures to accommodate different sizes of donor components.

9. The tool of any of clauses 1 to 8, wherein one of more of the pick-and-place structures comprise an alignment sensor configured to determine the position of the donor component at the donor structure.

10. The tool of any of clauses 1 to 9, wherein one of more of the pick-and-place structures comprise an alignment sensor configured to determine the position of an acceptor component at acceptor structure.

11. The tool of any of clauses 1 to 10, further comprising a push-up pin configured to push a donor component at donor structure in an upwards direction for pick up by a pick-up element.

12. The tool of any of clauses 1 to 11, wherein one or more of the pick-and-place structures comprises a positioner configured to move the pick-up element relative to another part of the pick-and-place structure.

13. The tool of any of clauses 1 to 12, wherein one or more of pick-and-place structures further comprise a side camera configured to determine the position of a donor component for pick-up by an adjacent pick-and-place structure.

14. The tool of any of clauses 1 to 13, wherein one or more of the holder structures has a glue dispenser configured to dispense glue on a donor component held by a pick-up element of an adjacent holder structure.

15. The tool of any of clauses 1 to 14, wherein one or more of the holder structures has a mirror configured to assist inspection of a back side of a donor component held by a pick-up element of an adjacent holder structure.

16. The tool of any of clauses 1 to 15, comprising a control system configured to move a pick-and-place structure along its holder structure until the relative position of the pick-and-place structure is arranged according to an orientation of a donor component at the donor structure.

17. The tool of any of clauses 1 to 16, comprising a control system configured to move a holder structure relative to another holder structure until a pick-and-place structure is arranged according to an orientation of a donor component at the donor structure.

18. The tool of any of clauses 1 to 17, comprising a control system configured to stack a back side of a donor component with a donor component at the acceptor structure.

19. The tool of any of clauses 1 to 18, comprising a control system configured to:
  after pick up of a donor component with a pick-up element, pass the donor component to a pick-up element of an adjacent pick-and-place structure;
  move one or more of the holder structures to in proximity with the acceptor structure; and
  stack a front side of the donor component with an acceptor component at the acceptor structure.

20. The tool of any of clauses 1 to 19, comprising a control system configured to:
  determine a position of a donor component of a first pick-and-place structure by an adjacent second pick-and-place structure; and
  transmit the determined position to the first pick-and-place structure.

21. The tool of any of clauses 1 to 20, wherein the donor component comprises a die.

22. The tool of any of clauses 1 to 21, wherein the acceptor structure comprises a die.

23. The tool of any of clauses 1 to 21, wherein the donor structure comprises a donor substrate and the acceptor structure comprises an acceptor substrate.

24. The tool of any of clauses 1 to 23, further comprising a sensor system configured to measure a relative position between the donor component and the acceptor structure using radiation passing through the donor component.

25. The tool of any of clauses 1 to 24, further comprising a sensor system configured to determine a relative position between the donor component and the acceptor structure by measuring a relative position between the donor component and another structure and between the another structure and the acceptor structure.

26. The tool of any of clauses 1 to 25, further comprising a sensor system located on a holder structure and configured to both measure the donor component and the acceptor structure.

27. The tool of any of clauses 1 to 26, further comprising a sensor system configured to measure a feature of the donor component and/or the acceptor structure relative to another feature of the same donor component and/or acceptor structure.

28. A method, comprising:
  adjusting a distance between at least two pick-and-place structures on a movable holder structure of a plurality of movable holder structures according to orientations of components at a donor structure, wherein the at least two pick-and-place structures are able to move along the holder structure independently and each holder structure accommodates two or more pick-and-place structures; and
  picking up the donor components using pick-up elements of the at least two pick-and-place structures.

29. The method of clause 28, wherein adjusting the distance between the at least two pick-and-place structures comprises moving at least one of the at least two pick-and-place structures along the holder structure until the relative positions of the at least two pick-and-place structures are arranged toward an orientation of the donor components at the donor structure.

30. The method of clause 28 or clause 29, further comprising moving the holder structure relative to another holder structure of the plurality of holder structures until the relative positions of the at least two pick-and-place structures are arranged toward an orientation of the donor components at the donor structure.

31. The method of any of clauses 28 to 30, further comprising moving one or more of the holder structures independently from another one or more of the holder structures.

32. The method of any of clauses 28 to 31, comprising providing a pitch between pick-and-place structures along the holder structure different than a pitch between holder structures.

33. The method of any of clauses 28 to 32, comprising controlling a pitch between pick-and-place structures and/or between holder structures to accommodate different sizes of donor components.

34. The method of any of clauses 28 to 33, further comprising inspecting a front side or edge of a donor component before picking up the donor component.

35. The method of any of clauses 28 to 34, further comprising inspecting a back side of a donor component with the aid of a mirror carried by an adjacent holder structure.

36. The method of any of clauses 28 to 35, further comprising moving one or more of the holder structures to in proximity with an acceptor structure, and stacking a back side of a donor component with an acceptor component at the acceptor structure.

37. The method of any of clauses 28 to 36, further comprising:

after picking up a donor component with a pick-up element, passing the donor component to a pick-up element of an adjacent pick-and-place structure;

moving one or more of the holder structures to in proximity with an acceptor structure; and stacking a front side of the donor component with an acceptor component at the acceptor structure.

39. The method of any of clauses 28 to 37, further comprising dispensing glue on a donor component held by a pick-up element of an adjacent pick-and-place structure.

40. The method of any of clauses 28 to 38, further comprising:

determining a position of a donor component of a first pick-and-place structure by an adjacent second pick-and-place structure; and transmitting the determined position to the first pick-and-place structure.

41. The method of any of clauses 28 to 40, wherein the donor component comprises a die.

42. The method of any of clauses 28 to 41, wherein the acceptor structure comprises a die.

43. The method of any of clauses 28 to 41, wherein the donor structure comprises a donor substrate and the acceptor structure comprises an acceptor substrate.

44. The method of any of clauses 28 to 43, further comprising measuring a relative position between the donor component and the acceptor structure using radiation passing through the donor component.

45. The method of any of clauses 28 to 44, further comprising determining a relative position between the donor component and the acceptor structure by measuring a relative position between the donor component and another structure and between the another structure and the acceptor structure.

46. The method of any of clauses 28 to 45, further comprising measuring both the donor component and the acceptor structure using a sensor system located on the holder structure.

47. The method of any of clauses 28 to 46, further comprising measuring a feature of the donor component and/or the acceptor structure relative to another feature of the same donor component and/or acceptor structure.

48. A non-transitory computer readable storage medium storing machine-readable instructions, wherein when executed, the machine-readable instructions cause the processor system to perform any of the methods of clauses 28 to 47.

Although specific reference may be made in this text to ICs, it should be understood that the tools described herein may have other applications, such as the processing of integrated optical or photonic systems, guidance and detection patterns for magnetic domain memories, flat-panel displays, liquid-crystal displays (LCDs), thin film magnetic heads, etc. The substrate referred to herein may be processed, before or after exposure, in for example a track (a tool that typically applies a layer of resist to a substrate and develops the exposed resist), a metrology tool and/or an inspection tool. Further, the substrate may be processed more than once, for example in order to create a multi-layer IC, so that the term substrate used herein may also refer to a substrate that already contains multiple processed layers.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

For example, various features of different embodiments may be combined together in any appropriate combination.

The breadth and scope of the present invention should not be limited by any of the above-described exemplary embodiments, but should be defined only in accordance with the following claims and their equivalents.

The invention claimed is:

1. A pick-and-place tool comprising:

a plurality of movable holder structures, each holder structure being elongate and having an axis of elongation in a direction of elongation of the respective holder structure; and a plurality of pick-and-place structures, each holder structure accommodating two or more of the pick-and-place structures, wherein at least one of the two or more pick-and-place structures of a respective holder structure is able to move along a respective holder structure independently from another at least one of the two or more pick-and-place structures of the respective holder structure, and wherein each pick-and-place structure comprises a pick-up element configured to pick up a donor component at a donor structure and place the donor component at an acceptor structure, one or more of the holder structures each configured to rotate about its respective axis of elongation.

2. The tool of claim 1, wherein one or more of the holder structures are configured to translate.

3. The tool of claim 2, wherein one or more of the holder structures are configured to translate relative to another one or more of the holder structures.

4. The tool of claim 2, wherein one or more of the holder structures are configured to move independently from another one or more of the holder structures.

5. The tool of claim 1, comprising a control system configured to cause a pitch between pick-and-place structures along a respective holder structure to be different than a pitch between holder structures.

6. The tool of claim 1, comprising a control system configured to control a pitch between pick-and-place structures and/or between holder structures to accommodate different sizes of donor components.

7. The tool of claim 1, wherein one of more of the pick-and-place structures comprise an alignment sensor configured to determine the position of the donor component at the donor structure, and/or to determine the position of an acceptor component at the acceptor structure.

8. The tool of claim 1, wherein one or more of the pick-and-place structures comprises a positioner configured to move the pick-up element relative to another part of the pick-and-place structure.

9. The tool of claim 1, wherein one or more of the pick-and-place structures further comprise a camera and further comprising a control system configured to determine the position of a donor component for pick-up by an adjacent pick-and-place structure from a signal of the camera.

10. The tool of claim 1, wherein one or more of the holder structures has a mirror configured to assist inspection of a back side of a donor component held by a pick-up element of an adjacent holder structure.

11. The tool of claim 1, comprising a control system configured to cause movement of a pick-and-place structure along its holder structure until the relative position of the pick-and-place structure is arranged according to an orientation of a donor component at the donor structure.

12. The tool of claim 1, comprising a control system configured to cause stacking of a back side of a donor component with a donor component at the acceptor structure.

13. The tool of claim 1, comprising a control system configured to cause:
    after pick up of a donor component with a pick-up element, passing of the donor component to a pickup element of an adjacent pick-and-place structure;
    movement of one or more of the holder structures to in proximity with the acceptor structure; and
    stacking of a front side of the donor component with an acceptor component at the acceptor structure.

14. The tool of claim 1, comprising a control system configured to:
    determine a position of a donor component of a first pick-and-place structure by an adjacent second pick-and-place structure; and
    transmit the determined position to the first pick-and-place structure.

15. The tool of claim 1, further comprising a sensor system configured to measure a feature of the donor component and/or the acceptor structure relative to another feature of the same donor component and/or acceptor structure.

16. A method for a pick-and-place tool comprising a plurality of movable holder structures, each holder structure being elongate and having an axis of elongation in a direction of elongation of the respective holder structure, and comprising a plurality of pick-and-place structures, each holder structure accommodating two or more of the pick-and-place structures and each pick-and-place structure comprising a pick-up element, the method comprising:
    moving at least one of the two or more pick-and-place structures of a respective holder structure along the respective holder structure independently from another at least one of the two or more pick-and-place structures of the respective holder structure,
    rotating a holder structure of the plurality of holder structures about its respective axis of elongation; and
    picking up a component at a donor structure and placing the component at an acceptor structure using at least one of the pick-up elements.

17. A non-transitory computer-readable storage medium of a pick-and-place tool comprising a plurality of movable holder structures, each holder structure being elongate and having an axis of elongation in a direction of elongation of the respective holder structure, and comprising a plurality of pick-and-place structures, each holder structure accommodating two or more of the pick-and-place structures and each pick-and-place structure comprising a pick-up element, the computer-readable storage medium storing machine-readable instructions, the machine-readable instructions, when executed, cause a processor system to cause:
    movement of at least one of the two or more pick-and-place structures of a respective holder structure along the respective holder structure independently from another at least one of the two or more pick-and-place structures of the respective holder structure;
    rotation of a holder structure of the plurality of holder structures about its respective axis of elongation; and
    picking up of a component at a donor structure and placing the component at an acceptor structure using at least one of the pick-up elements.

18. The computer-readable storage medium of claim 17, wherein the instructions are further configured to cause the processor system to cause one or more of the holder structures to translate.

19. The computer-readable storage medium of claim 17, wherein the instructions are further configured to cause the processor system to cause a pitch between pick-and-place structures along a respective holder structure to be different than a pitch between holder structures.

20. The computer-readable storage medium of claim 17, wherein the instructions are further configured to cause the processor system to cause a change of a pitch between pick-and-place structures and/or between holder structures to accommodate different sizes of donor components.

* * * * *